US012627317B2

(12) United States Patent
Park

(10) Patent No.: US 12,627,317 B2
(45) Date of Patent: May 12, 2026

(54) DATA ENCODING, DATA DECODING, A SEMICONDUCTOR APPARATUS AND A SEMICONDUCTOR SYSTEM USING THE SAME

(71) Applicant: SK hynix Inc., Icheon-si (KR)

(72) Inventor: Hyun Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 184 days.

(21) Appl. No.: 18/736,251

(22) Filed: Jun. 6, 2024

(65) Prior Publication Data

US 2025/0202501 A1 Jun. 19, 2025

(30) Foreign Application Priority Data

Dec. 13, 2023 (KR) ........................ 10-2023-0180904

(51) Int. Cl.
*H03M 7/30* (2006.01)
(52) U.S. Cl.
CPC ....... *H03M 7/6011* (2013.01); *H03M 7/3066* (2013.01); *H03M 7/6005* (2013.01)
(58) Field of Classification Search
CPC .... H03M 7/30; H03M 7/6011; H03M 7/6005; H03M 7/3066
See application file for complete search history.

(56) References Cited

U.S. PATENT DOCUMENTS

| | | | | |
|---|---|---|---|---|
| 7,113,550 B2 * | 9/2006 | Stonecypher | ....... | H04L 25/4919 375/353 |
| 8,798,189 B2 * | 8/2014 | Kirkpatrick | ............. | H04L 25/49 327/52 |
| 9,252,997 B1 * | 2/2016 | Mishra | .................... | H04L 27/06 |
| 9,360,520 B2 * | 6/2016 | Yun | ................... | G01R 31/31724 |
| 10,404,408 B1 * | 9/2019 | Lin | ........................ | H04L 1/0045 |
| 10,651,979 B1 * | 5/2020 | Katakwar | ................ | H03K 5/22 |
| 10,812,102 B2 * | 10/2020 | Cornelius | ............... | H03M 7/46 |
| 11,290,132 B1 * | 3/2022 | Wang | .................... | H04L 1/0059 |
| 11,411,579 B2 | 8/2022 | Cornelius et al. | | |
| 2003/0194017 A1 * | 10/2003 | Woodworth | ............ | H04L 27/24 375/286 |
| 2005/0078712 A1 * | 4/2005 | Voutilainen | ......... | H04L 25/4917 370/535 |
| 2012/0243615 A1 * | 9/2012 | Tu | ........................ | H04N 19/162 375/240.24 |
| 2012/0249229 A1 * | 10/2012 | Ko | ........................... | G11C 8/12 327/564 |

(Continued)

OTHER PUBLICATIONS

Park, Hyunsu, et al. "30-Gb/s 1.11-pJ/bit single-ended PAM-3 transceiver for high-speed memory links." IEEE Journal of Solid-State Circuits 56.2 (2020): 581-590.

*Primary Examiner* — Lam T Mai
(74) *Attorney, Agent, or Firm* — WILLIAM PARK AND ASSOCIATES LTD.

(57) ABSTRACT

A data encoding method encodes eleven binary bits as seven symbols. The data encoding method generates a check signal based on first to fourth bits. The data encoding method includes encoding first to fifth bits to generate first to third symbols. The method includes encoding sixth to eighth bits to generate fourth and fifth symbols. The method also includes encoding ninth to eleventh bits to generate sixth and seventh symbols, when the check signal has a first logic level.

33 Claims, 8 Drawing Sheets

(56) References Cited

U.S. PATENT DOCUMENTS

| | | | | |
|---|---|---|---|---|
| 2013/0094603 | A1* | 4/2013 | Pandey | H04L 5/1423 |
| | | | | 375/295 |
| 2014/0233673 | A1* | 8/2014 | Smith | H04L 27/04 |
| | | | | 375/296 |
| 2014/0317472 | A1* | 10/2014 | Kim | H03M 13/21 |
| | | | | 714/767 |
| 2016/0380721 | A1* | 12/2016 | Schultz | H04L 1/0011 |
| | | | | 375/296 |
| 2018/0012665 | A1* | 1/2018 | Park | G11C 7/1006 |
| 2018/0032415 | A1* | 2/2018 | Song | G11C 29/52 |
| 2020/0007155 | A1* | 1/2020 | Cornelius | H03M 7/3059 |
| 2021/0105023 | A1* | 4/2021 | Cornelius | H03M 7/46 |
| 2023/0170920 | A1* | 6/2023 | Koganei | H03M 13/356 |
| | | | | 714/755 |

* cited by examiner

210

TB<0:10> → DATA ENCODING CIRCUIT — S0-S6 → Tx → MS

220

MS → Rx — S0-S6 → DATA DECODING CIRCUIT → RB<0:10>

VREFH/VREFL

FIG. 3

| B<0:2> | T<0:3> | S11 | S12 |
|--------|--------|-----|-----|
| 000 | 1000 | M | L |
| 001 | 1100 | H | L |
| 010 | 1111 | H | H |
| 011 | 1110 | H | M |
| 100 | 0011 | L | H |
| 101 | 0010 | L | M |
| 110 | 1011 | M | H |
| 111 | 1010 | M | M |

FIG. 4

| B<0:4> | T<0:1> | T<2:3> | T<4:5> | S11 | S12 | S13 | CHK |
|---|---|---|---|---|---|---|---|
| 00000 | 11 | 10 | 00 | H | M | L | 0 |
| 00001 | 11 | 11 | 00 | H | H | L | 0 |
| 00010 | 11 | 11 | 11 | H | H | H | 0 |
| 00011 | 11 | 11 | 10 | H | H | M | 0 |
| 00100 | 11 | 00 | 11 | H | L | H | 0 |
| 00101 | 11 | 00 | 10 | H | L | M | 0 |
| 00110 | 11 | 10 | 11 | H | M | H | 0 |
| 00111 | 11 | 10 | 10 | H | M | M | 0 |
| 01000 | 10 | 10 | 00 | M | M | L | 0 |
| 01001 | 10 | 11 | 00 | M | H | L | 0 |
| 01010 | 10 | 11 | 11 | M | H | H | 0 |
| 01011 | 10 | 11 | 10 | M | H | M | 0 |
| 01100 | 10 | 00 | 11 | M | L | H | 0 |
| 01101 | 10 | 00 | 10 | M | L | M | 0 |
| 01110 | 10 | 10 | 11 | M | M | H | 0 |
| 01111 | 10 | 10 | 10 | M | M | M | 0 |
| 10000 | 00 | 10 | 00 | L | M | L | 0 |
| 10001 | 00 | 11 | 00 | L | H | L | 0 |
| 10010 | 00 | 11 | 11 | L | H | H | 0 |
| 10011 | 00 | 11 | 10 | L | H | M | 0 |
| 10100 | 00 | 00 | 11 | L | L | H | 0 |
| 10101 | 00 | 00 | 10 | L | L | M | 0 |
| 10110 | 00 | 10 | 11 | L | M | H | 0 |
| 10111 | 00 | 10 | 10 | L | M | M | 0 |
| 11000 | 10 | 00 | 00 | M | L | L | 0 |
| 11001 | 11 | 00 | 00 | H | L | L | 0 |
| 11010 | xx | 01 | xx | | H | | 1 |
| 11011 | xx | 01 | xx | | H | | 1 |
| 11100 | xx | 10 | xx | | L | | 1 |
| 11101 | xx | 10 | xx | | L | | 1 |
| 11110 | xx | 11 | xx | | M | | 1 |
| 11111 | xx | 11 | xx | | M | | 1 |

Figure 5:
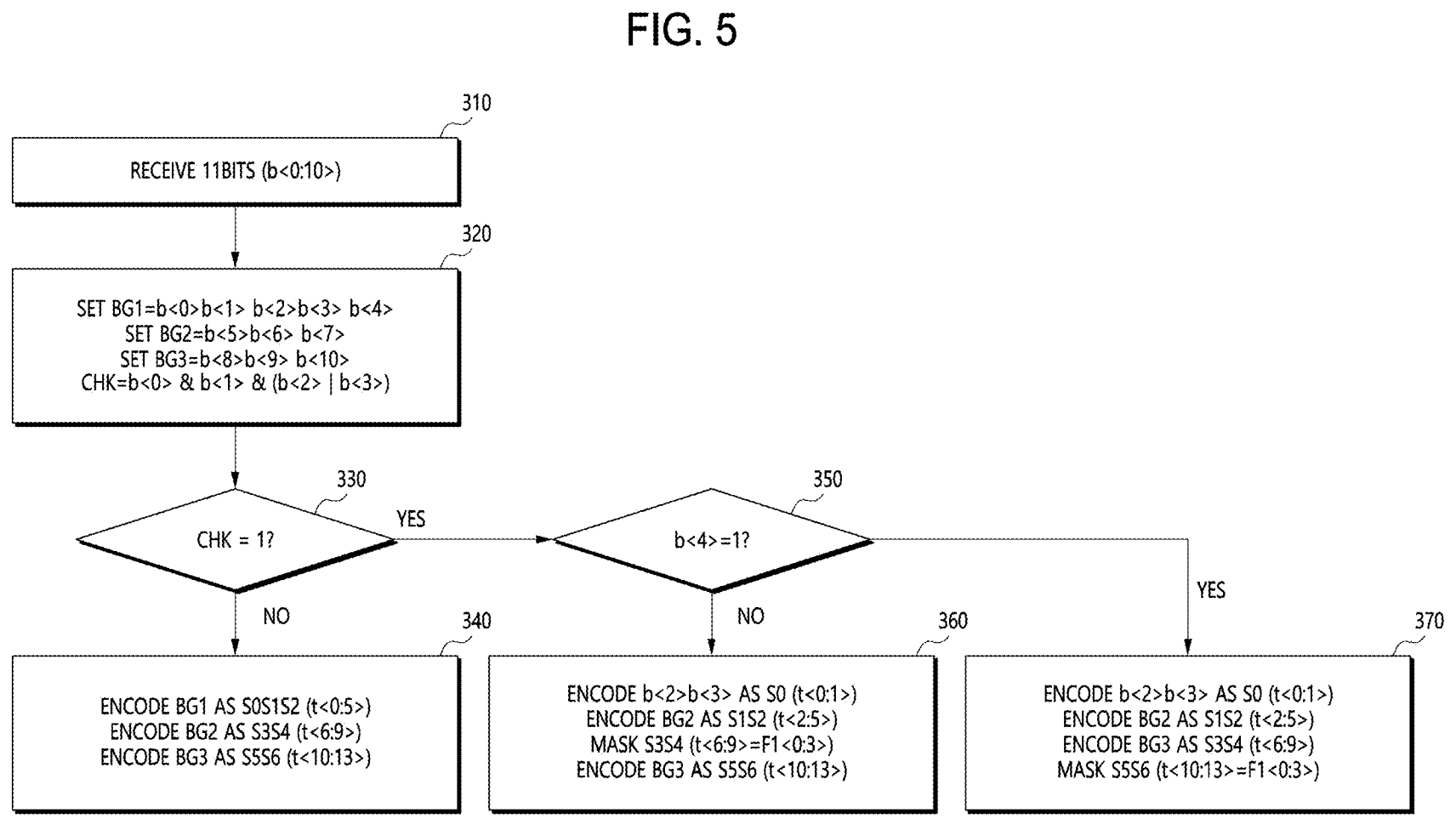

RECEIVE 11BITS (b<0:10>)

320

SET BG1=b<0> b<1> b<2>b<3> b<4>
SET BG2=b<5>b<6> b<7>
SET BG3=b<8>b<9> b<10>
CHK=b<0> & b<1> & (b<2> | b<3>)

330

CHK = 1?

YES

NO

340

ENCODE BG1 AS S0S1S2 (t<0:5>)
ENCODE BG2 AS S3S4 (t<6:9>)
ENCODE BG3 AS S5S6 (t<10:13>)

350 b<4>=1?

NO

YES

360

ENCODE b<2>b<3> AS S0 (t<0:1>)
ENCODE BG2 AS S1S2 (t<2:5>)
MASK S3S4 (t<6:9>>=F1<0:3>)
ENCODE BG3 AS S5S6 (t<10:13>)

370

ENCODE b<2>b<3> AS S0 (t<0:1>)
ENCODE BG2 AS S1S2 (t<2:5>)
ENCODE BG3 AS S3S4 (t<6:9>)
MASK S5S6 (t<10:13>=F1<0:3>)

Figure 6:
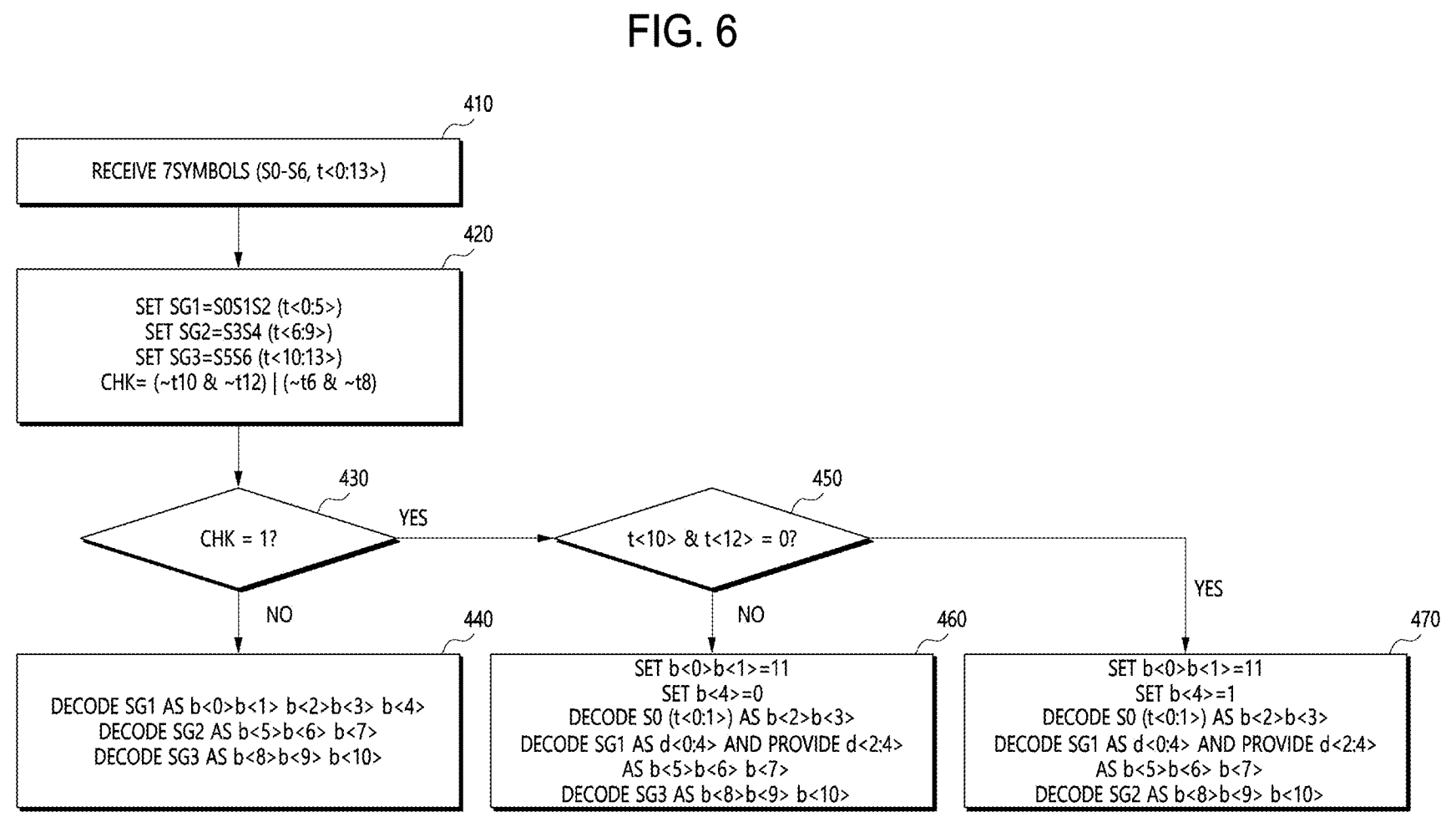

RECEIVE 7 SYMBOLS (S0-S6, t<0:13>)

420

SET SG1=S0S1S2 (t<0:5>)
SET SG2=S3S4 (t<6:9>)
SET SG3=S5S6 (t<10:13>)
CHK= (~t10 & ~t12) | (~t6 & ~t8)

430

CHK = 1?

440 (NO)

DECODE SG1 AS b<0>b<1> b<2>b<3> b<4>
DECODE SG2 AS b<5>b<6> b<7>
DECODE SG3 AS b<8>b<9> b<10>

450 (YES)

t<10> & t<12> = 0?

460 (NO)

SET b<0>b<1>=11
SET b<4>=0
DECODE S0 (t<0:1>) AS b<2>b<3>
DECODE SG1 AS d<0:4> AND PROVIDE d<2:4>
AS b<5>b<6> b<7>
DECODE SG3 AS b<8>b<9> b<10>

470 (YES)

SET b<0>b<1>=11
SET b<4>=1
DECODE S0 (t<0:1>) AS b<2>b<3>
DECODE SG1 AS d<0:4> AND PROVIDE d<2:4>
AS b<5>b<6> b<7>
DECODE SG2 AS b<8>b<9> b<10>

1

DATA ENCODING, DATA DECODING, A SEMICONDUCTOR APPARATUS AND A SEMICONDUCTOR SYSTEM USING THE SAME

CROSS-REFERENCES TO RELATED APPLICATION

The present application claims priority under 35 U.S.C. § 119 (a) to Korean patent application number 10-2023-0180904 filed on Dec. 13, 2023, in the Korean Intellectual Property Office, which application is incorporated herein by reference in its entirety.

BACKGROUND

1. Technical Field

Various embodiments generally relate to integrated circuit technology, and, more particularly, to data encoding, data decoding, and a semiconductor apparatus and a semiconductor system using the same.

2. Related Art

An electronic device includes many electronic elements. A computer system, for example, includes many semiconductor apparatuses each configured by a semiconductor. The semiconductor apparatuses constituting a computer system may communicate with each other by transmitting and receiving clock signals and data. The semiconductor apparatuses may be connected to other semiconductor apparatus through a data bus and may transmit and receive signals having information corresponding to the data through a signal bus. Typically, a Non-Return-to-Zero (NRZ) signal having a logic level of 0 or 1 may be transmitted through the data bus. However, to transmit more information with one signal transmission, a multi-level signal transmission method using Pulse Amplitude Modulation (PAM) is being used. The multi-level signal transmission method can transmit two or more bits of digital information as one analog signal by subdividing a level of an analog voltage transmitted through the signal bus.

To use the multi-level signal transmission method, the semiconductor apparatuses may have a transmitter circuit that encodes a plurality of bits of data to generate a plurality of symbols, and transmits a multi-level signal having three or more voltage levels based on each symbol to the data bus. Further, the semiconductor apparatuses may have a receiver circuit for receiving the multi-level signal transmitted through the data bus to restore the symbols, and for decoding the symbols to generate the plurality of bits of data.

SUMMARY

In an embodiment, a data encoding method may include setting first to fifth bits as a first bit group, sixth to eighth bits as a second bit group, and ninth to eleventh bits as a third bit group. The method may include generating a check signal based on the first to fourth bits. And the method may include encoding the first to third bit groups based on the check signal and the fifth bit to generate first to seventh symbols.

In an embodiment, when the check signal is at a first logic level, the first to third symbols may be generated by encoding the first bit group, the fourth and fifth symbols may be generated by encoding the second bit group, and the sixth and seventh symbols may be generated by encoding the third bit group.

In an embodiment, a data decoding method may include setting first to third symbols as a first symbol group, fourth and fifth symbols as a second symbol group, and sixth and seventh symbols as a third symbol group. The method may include generating a check signal based on least significant bits of the fourth to seventh symbols. And the method may include decoding the first to third symbol groups based on the check signal and the least significant bits of the sixth and seventh symbols to generate first to eleventh bits.

In an embodiment, when the check signal is at a first logic level, the first symbol group may be decoded as the first to fifth bits, the second symbol group may be decoded as the sixth to eighth bits, and the third symbol group may be decoded as the ninth to eleventh bits.

In an embodiment, a data encoding circuit may include a first encoding circuit, a second encoding circuit, a third encoding circuit, a check logic circuit, and a selection logic circuit. The first encoding circuit may be configured to encode first to fifth bits to generate first to sixth encoding bits, may be configured to output one of the first and second encoding bits and the third and fourth encoding bits as a first symbol based on a check signal, and may be configured to output the third to sixth encoding bits and seventh to tenth encoding bits as a second symbol and a third symbol based on the check signal. The second encoding circuit may be configured to encode sixth to eighth bits to generate the seventh to tenth encoding bits, and may be configured to output one of the seventh to tenth encoding bits, eleventh to fourteenth encoding bits, and a fixed value as a fourth symbol and a fifth symbol based on the check signal and the fifth bit. The third encoding circuit may be configured to encode ninth to eleventh bits to generate the eleventh to fourteenth encoding bits, and may be configured to output one of the eleventh to fourteenth encoding bits and the fixed value as a sixth symbol and a seventh symbol based on a selection signal. The check logic circuit may be configured to generate the check signal based on the first to fourth bits. The selection logic circuit may be configured to generate the selection signal based on the check signal and the fifth bit.

In an embodiment, a data decoding circuit may include a first decoding circuit, a second decoding circuit, a third decoding circuit, and a control logic circuit. The first decoding circuit may be configured to decode first to third symbols to generate first to fifth decoding bits, may be configured to decode the first symbol to generate twelfth and thirteenth decoding bits, may be configured to output one of the first and second decoding bits and a fixed value as first and second bits based on a check signal, may be configured to output one of the third and fourth decoding bits and the twelfth and thirteenth decoding bits as third and fourth bits based on the check signal, and may be configured to output one of the fifth decoding bit and a logic bit as a fifth bit based on the check signal. The second decoding circuit may be configured to decode fourth and fifth symbols to generate sixth to eighth decoding bits, and may be configured to output one of the sixth to eighth decoding bits and the third to fifth decoding bits as sixth to eighth bits based on the check signal. The third decoding circuit may be configured to decode sixth and seventh symbols to generate ninth to eleventh decoding bits, and may be configured to output one of the ninth to eleventh decoding bits and the sixth to eighth decoding bits as ninth to eleventh bits based on a selection signal. The control logic circuit may be configured to generate the check signal, the logic bit, and the selection signal based on least significant bits of the fourth to seventh symbols.

BRIEF DESCRIPTION OF THE DRAWINGS

FIG. 3 is a diagram illustrating a 3b2s mapping table according to an embodiment.

FIG. 4 is diagram illustrating a 5b3s mapping table according to an embodiment.

FIG. 5 is a flowchart illustrating a data encoding method according to an embodiment.

FIG. 6 is a flowchart illustrating a data decoding method according to an embodiment.

DETAILED DESCRIPTION

Figure 1:
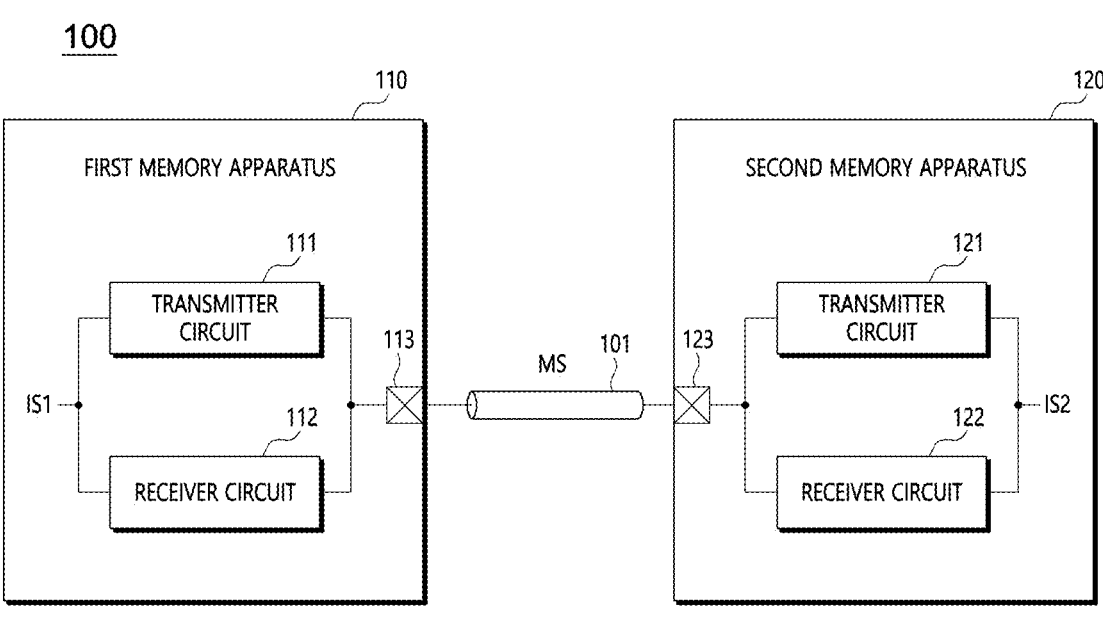
FIG. 1 is a diagram illustrating a configuration of a semiconductor system and a voltage level of a multi-level signal transmitted through a transmission signal bus according to an embodiment.
Figure 1:
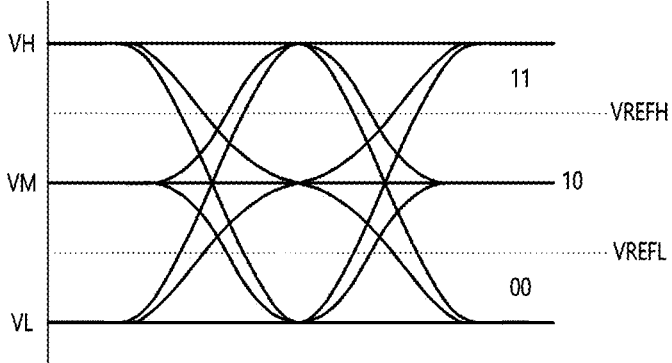

FIG. 1 is a diagram illustrating a configuration of a semiconductor system 100 and a voltage level of a multi-level signal MS transmitted through a transmission signal bus 101 according to an embodiment of the present disclosure. Referring to FIG. 1, the semiconductor system 100 may include a first semiconductor apparatus 110 and a second semiconductor apparatus 120. The first semiconductor apparatus 110 may be a master apparatus that provides various control signals required for the second semiconductor apparatus 120 to operate. The first semiconductor apparatus 110 may include various types of host devices. For example, the first semiconductor apparatus 110 may include at least one of a central processing unit (CPU), a graphic processing unit (GPU), a multi-media processor (MMP), a digital signal processor (DSP), an application processor (AP), and a memory controller. The second semiconductor apparatus 120 may be a slave apparatus capable of receiving the control signals from the first semiconductor apparatus 110 to perform various operations. For example, the second semiconductor apparatus 120 may be a memory apparatus, and the memory apparatus may include volatile memory and/or non-volatile memory. The volatile memory may include SRAM (Static RAM), DRAM (Dynamic RAM), SDRAM (Synchronous DRAM), and the non-volatile memory may include ROM (Read-Only Memory), PROM (Programmable ROM), EEPROM (Electrically Erasable and Programmable ROM), EPROM (Erasable and Programmable ROM), flash memory, PRAM (Phase change RAM), MRAM (Magnetic RAM), RRAM (Resistive RAM), and FRAM (Ferroelectric RAM).

The second semiconductor apparatus 120 may be coupled to the first semiconductor apparatus 110 through a plurality of buses. The plurality of buses may be signal transmission lines, links, or channels for transmitting signals. Although not shown, for example, the plurality of buses may include a clock bus, a command address bus, and a data bus. The clock bus and the command address bus may be unidirectional buses from the first semiconductor apparatus 110 to the second semiconductor apparatus 120, and the data bus may be bidirectional bus. The second semiconductor apparatus 120 may be coupled to the first semiconductor apparatus 110 through the transmission signal bus 101. The transmission signal bus 101 may include any kind of bus that transmits a signal synchronized to a clock signal. For example, the transmission signal bus 101 may be a bidirectional bus, such as the data bus. In an embodiment, the transmission signal bus 101 may be a unidirectional bus, and technical ideas of the present disclosure may be similarly applicable when the transmission signal bus 101 is a unidirectional bus. The transmission signal bus 101 may be a multi-level signal transmission line transmitting a multi-level signal MS. For example, the multi-level signal MS may have at least three different voltage levels, and the multi-level signal MS may have a voltage level of one of the three different voltage levels according to a value of a symbol. The symbol may include at least two binary bits. The symbol may be a three-level symbol having at least a first state, a second state, and a third state. The first state may be a high state, and the symbol representing the first state may have a logic value of '1, 1'. For example, both a least significant bit and a most significant bit of the symbol representing the first state may be 1. The second state may be a middle state, and the symbol representing the second state may have a logic value of '1, 0'. A least significant bit of the symbol representing the second state may be 1 and a most significant bit may be 0. The third state may be a low state, and the symbol representing the third state may have a logic value of '0, 0'. Both a least significant bit and a most significant bit of the symbol representing the third state may be 0. The multi-level signal MS may have a first voltage level VH, a second voltage level VM, and a third voltage level VL.

A graph shown in FIG. 1 is a diagram illustrating a voltage level of the multi-level signal MS transmitted through the transmission signal bus 101. To transmit a symbol of the first state, the multi-level signal MS may have the first voltage level VH. To transmit a symbol of the second state, the multi-level signal MS may have the second voltage level VM. To transmit a symbol of the third state, the multi-level signal MS may have the third voltage level VL. The second voltage level VM may be lower than the first voltage level VH, and the third voltage level VL may be lower than the second voltage level VM. The multi-level signal MS may be maintained at current voltage level or may be changed to one of the other two voltage levels depending on whether a state of the symbol transitions. For example, when the symbol transitions from the second state to the third state, the multi-level signal MS may change from the second voltage level VM to the third voltage level VL. A voltage level of the multi-level signal MS and a state of the symbol may be determined using at least two reference voltages. The at least two reference voltages may include a first reference voltage VREFH and a second reference voltage VREFL. The first reference voltage VREFH may have a voltage level corresponding to a middle between the first voltage level VH and the second voltage level VM. The second reference voltage VREFL may have a voltage level corresponding to a middle between the second voltage level VM and the third voltage level VL. When the multi-level signal MS has a voltage level higher than the first reference voltage VREFH, the multi-level signal MS may be determined to represent a symbol of the first state. When the multi-level signal MS has a voltage level lower than the first reference voltage VREFH and higher than the second reference voltage VREFL, the multi-level signal MS may be determined to represent a symbol of the second state. When the multi-level signal MS has a voltage level lower than the second reference voltage VREFL, the multi-level signal MS may be determined to represent a symbol of the third state.

The first semiconductor apparatus 110 may include a transmitter circuit 111 and a receiver circuit 112. The transmitter circuit 111 and the receiver circuit 112 may be coupled with the transmission signal bus 101 through a pad 113. The transmitter circuit 111 may receive an internal signal IS1 of the first semiconductor apparatus 110, and transmit the multi-level signal MS generated based on the internal signal IS1 to the second semiconductor apparatus 120 through the pad 113 and the transmission signal bus 101. The receiver circuit 112 may receive the multi-level signal MS transmitted through the transmission signal bus 101 and the pad 113, and may generate the internal signal IS1 based on the multi-level signal MS. For example, the transmitter circuit 111 may generate the multi-level signal MS having a voltage level corresponding to one of the first to third voltages VH, VM, VL according to a state of a symbol generated based on a bit stream of the internal signal IS1. The transmitter circuit 111 may encode the bit stream of the internal signal IS1, which is a digital signal, to generate a symbol, and may convert the symbol to the multi-level signal MS, which is an analog voltage. The receiver circuit 112 may detect a voltage level of the multi-level signal MS to restore the symbol. The receiver circuit 112 may use the first and second reference voltages VREFH, VREFL to restore the symbol from the multi-level signal. The receiver circuit 112 may decode the symbol to generate the bit stream of the internal signal IS1.

The second semiconductor apparatus 120 may include a transmitter circuit 121 and a receiver circuit 122. The transmitter circuit 121 and the receiver circuit 122 may be coupled with the transmission signal bus 101 through a pad 123. The transmitter circuit 121 may receive an internal signal IS2 of the second semiconductor apparatus 120, and transmit the multi-level signal MS generated based on the internal signal IS2 to the first semiconductor apparatus 110 through the pad 123 and the transmission signal bus 101. The receiver circuit 122 may receive the multi-level signal MS transmitted through the transmission signal bus 101 and the pad 123, and may generate the internal signal IS2 based on the multi-level signal MS. For example, the transmitter circuit 121 may generate the multi-level signal MS having a voltage level corresponding to one of the first to third voltages VH, VM, VL according to a state of a symbol generated based on a bit stream of the internal signal IS2. The transmitter circuit 121 may encode the bit stream of the internal signal IS2, which is a digital signal, to generate the symbol, and may convert the symbol to the multi-level signal MS, which is an analog voltage. The receiver circuit 122 may detect a voltage level of the multi-level signal MS to restore the symbol. The receiver circuit 122 may use the first and second reference voltages VREFH, VREFL to restore the symbol from the multi-level signal. The receiver circuit 122 may decode the symbol to generate the bit stream of the internal signal IS2.

Figure 2A:
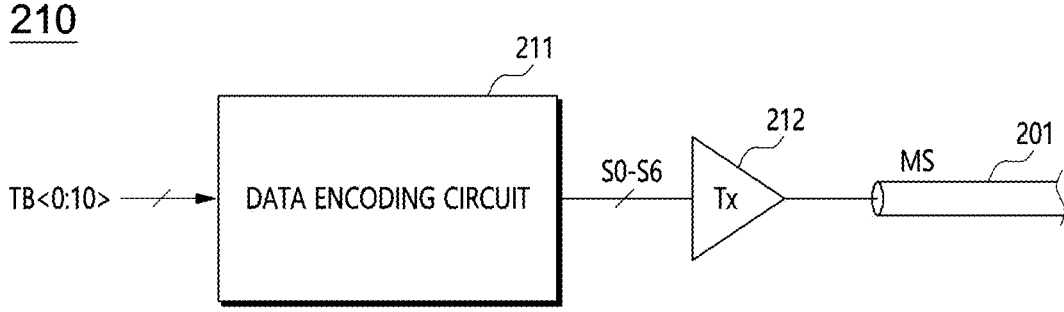
FIG. 2A is a diagram illustrating a configuration of a transmitter circuit according to an embodiment.

FIG. 2A is a diagram illustrating a configuration of a transmitter circuit 210 according to an embodiment of the present disclosure. The transmitter circuit 210 may be applied as the transmitter circuits 111, 121 of the first and second semiconductor apparatuses 110, 120 shown in FIG. 1, respectively. Referring to FIG. 2A, the transmitter circuit 210 may receive a plurality of bits TB<0:10> of transmission data, and may encode the plurality of bits TB<0:10> of the transmission data to generate a plurality of symbols S0 to S6. For example, the transmitter circuit 210 may utilize a coding scheme that encodes 11 binary bits as seven three-level symbols. Because the 11 binary bits can define a total of 2048 logic values, and the seven three-level symbols can provide a total of 2187 combinations, all of 2048 logic values can be mapped to all 2048 combinations. Thus, the number of unused combinations may be minimized and efficient coding may be possible. The transmitter circuit 210 may generate a multi-level signal MS based on the plurality of symbols S0 to S6. The transmitter circuit 210 may drive the signal transmission line 201 based on the plurality of symbols S0 through S6 to transmit a series of multi-level signals MS corresponding to the plurality of symbols S0 to S6 via the signal transmission line 201.

The transmitter circuit 210 may include a data encoding circuit 211 and a transmitter 212. The data encoding circuit 211 may receive first to eleventh bits TB<0:10> of the transmission data, and may encode the first to eleventh bits TB<0:10> of the transmission data to generate the first to seventh symbols S0 to S6. Each of the first to seventh symbols S0 to S6 may be expressed and/or identified using a least significant bit and a most significant bit. The data encoding circuit 211 may separate the first to eleventh bits TB<0:10> of the transmission data as a plurality of bit groups, and may improve encoding efficiency by encoding the plurality of bit groups separately. When encoding the plurality of bit groups separately, using the most simplified mapping table may reduce the complexity of the encoding circuit and improve the speed of the encoding operation. For example, the data encoding circuit 211 may set the first to fifth bits TB<0:4> as a first bit group, and encode the first bit group to generate first to third symbols S0, S1, S2. The data encoding circuit 211 may set the sixth to eighth bits TB<5:7> as a second bit group, and may encode the second bit group to generate the fourth and fifth symbols S3, S4. The data encoding circuit 211 may set the ninth to eleventh bits TB<8:10> as a third bit group, and may encode the third bit group to generate the sixth and seventh symbols S5, S6.

The transmitter 212 may receive the first to seventh symbols S0 to S6, and generate the multi-level signal MS based on the first to seventh symbols S0 to S6. The transmitter 212 may transmit the multi-level signal MS by driving the signal transmission line 201 with a different voltage level according to the logic levels of a least significant bit and a most significant bit of the first to seventh symbols S0 to S6. The transmitter 212 may include at least two voltage drivers to drive the signal transmission line 201 based on a logic level of the least significant bit and a logic level of the most significant bit of each of the first to seventh symbols S0 to S6.

Figure 2B:
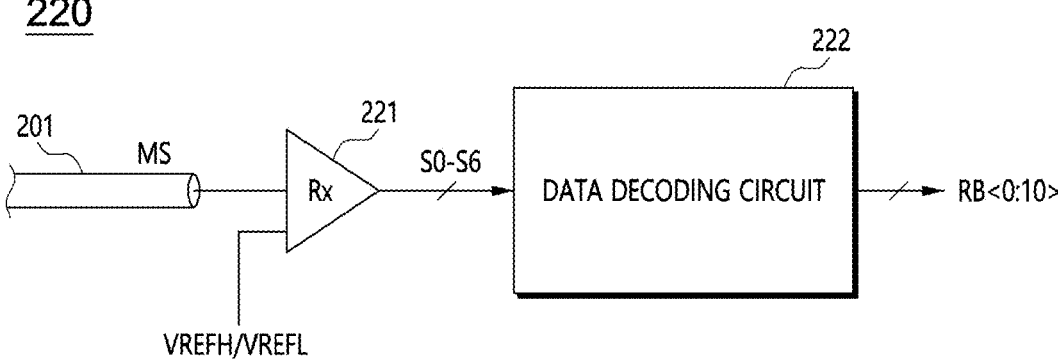
FIG. 2B is a diagram illustrating a configuration of a receiver circuit according to an embodiment.

FIG. 2B is a diagram illustrating a configuration of a receiver circuit 220 according to an embodiment of the present disclosure. The receiver circuit 220 may be applied as the receiver circuits 112, 122 of the first and second semiconductor apparatuses 110, 120 shown in FIG. 1, respectively. Referring to FIG. 2B, the receiver circuit 220 may receive the multi-level signal MS transmitted from the transmitter circuit 210 through the signal transmission line 201, and may restore the plurality of symbols S0 to S6 from the multi-level signal MS. The receiver circuit 220 may restore the plurality of symbols S0 to S6 by comparing a series of multi-level signals MS with the first reference voltage VREFH and the second reference voltage VREFL, respectively. The receiver circuit 220 may decode the plurality of symbols S0 to S6 to generate a plurality of bits RB<0:10> of received data. For example, the receiver circuit 220 may use a coding scheme that decodes seven three-level symbols as 11 binary bits.

The receiver circuit 220 may include a receiver 221 and a data decoding circuit 222. The receiver 221 may receive the multi-level signal MS through the signal transmission line 201, and may receive the first and second reference voltages VREFH, VREFL. The receiver 221 may compare the multi-level signal MS with the first and second reference voltages VREFH, VREFL to generate the plurality of symbols S0 to S6. The receiver 221 may include at least two comparators for comparing the multi-level signal MS with the first and second reference voltages VREFH, VREFL.

The data decoding circuit 222 may receive the first to seventh symbols S0 to S6, and may decode the first to seventh symbols S0 to S6 to generate first to eleventh bits RB<0:10> of the received data. The data decoding circuit 222 may separate the first to seventh symbols S0 to S6 as a plurality of symbol groups, and decode the plurality of symbol groups separately to improve decoding efficiency. For example, the data decoding circuit 222 may set the first to third symbols S0, S1, S2 as a first symbol group, and decode the first symbol group to generate first to fifth bits RB<0:4> of the received data. The data decoding circuit 222 may set the fourth and fifth symbols S3, S4 as a second symbol group, and may decode the second symbol group to generate sixth to eighth bits RB<5:7> of the received data. The data decoding circuit 222 may set the sixth and seventh symbols S5, S6 as a third symbol group, and decode the third symbol group to generate the ninth to eleventh bits RB<8:10> of the received data.

FIG. 3 is a diagram illustrating a 3b2s mapping table according to an embodiment of the present disclosure. Referring to FIG. 3, the 3b2s mapping table may be used to encode three binary bits B<0:2> as two three-level symbols S11, S12, or to decode two three-level symbols S11, S12 as three binary bits B<0:2>. Hereinafter, encoding three binary bits as two three-level symbols may be referred to as 3b2s, and decoding two three-level symbols as three binary bits may be referred to as 2s3b. The three binary bits B<0:2> can have a total of eight logic values, and the two three-level symbols S11, S12 can have a total of nine combinations. The eight logic values may be mapped to eight combinations, and one combination may be unused. The first to third bits B<0:2> having a logic value of 000 may be mapped to a first symbol S11 having a least significant bit T<0> of 1 and a most significant bit T<1> of 0 and a second symbol S12 having a least significant bit T<2> and a most significant bit T<3> of 0. The first symbol S11 may be a symbol of a middle state M, and the second symbol S12 may be a symbol of a low state L. The first to third bits B<0:2> having a logic value of 001 may be mapped to the first symbol S11 having the least significant bit T<0> and the most significant bit T<1> of 1 and the second symbol S12 having the least significant bit T<2> and the most significant bit T<3> of 0. The first symbol S11 may be a symbol of a high state H, and the second symbol S12 may be a symbol of the low state L. The first to third bits B<0:2> having a logic value of 010 may be mapped to the first and second symbols S11, S12 having the least significant bits T<0>, T<2> and the most significant bits T<1>, T<3> of 1. The first and second symbols S11, S12 may be symbols of the high state H. The first to third bits B<0:2> having a logic value of 011 may be mapped to the first symbol S11 having the least significant bit T<0> and the most significant bit T<1> of 1 and the second symbol S12 having the least significant bit T<2> of 1 and the most significant bit T<3> of 0. The first symbol S11 may be a symbol of the high state H, and the second symbol S12 may be a symbol of the middle state M. The first to third bits B<0:2> having a logical value of 100 may be mapped to the first symbol S11 having the least significant bit T<0> and the most significant bit T<1> of 0 and the second symbol S12 having the least significant bit T<2> and the most significant bit T<3> of 1. The first symbol S11 may be a symbol of the low state L, and the second symbol S12 may be a symbol of the high state H. The first to third bits B<0:2> having a logic value of 101 may be mapped to the first symbol S11 having the least significant bit T<0> and the most significant bit T<1> of 0 and the second symbol S12 having the least significant bit T<2> of 1 and the most significant bit T<3> of 0. The first symbol S11 may be a symbol of the low state L, and the second symbol S12 may be a symbol of the middle state M. The first to third bits B<0:2> having a logic value of 110 may be mapped to the first symbol S11 having the least significant bit T<0> of 1 and the most significant bit T<1> of 0 and the second symbol S12 having the least significant bit T<2> and the most significant bit T<3> of 1. The first symbol S11 may be a symbol of the middle state M, and the second symbol S12 may be a symbol of the high state H. The first to third bits B<0:2> having a logic value of 111 may be mapped to the first and second symbols S11, S12 having the least significant bits T<0>, T<2> of 1 and the most significant bits T<1>, T<3> of 0. The first and second symbols S11, S12 may be symbols of the middle state M.

A combination of the first and second symbols S11, S12 whose least significant bits and most significant bits are 0 (i.e., T<0:3>=0000) may be unused. In an embodiment, the one combination of the unused first and second symbols S11, S12 may be changed according to a termination voltage level of the signal transmission line 201 transmitting the multi-level signal MS shown in FIGS. 2A and 2B. For example, when the signal transmission line 201 uses a high-tapped termination, the combination of T<0:3>=0000 might not map to a logic value of the first to third bits B<0:2>, as the combination of T<0:3>=0000 may result in the most current consumption in the signal transmission line 201. In an embodiment, when the signal transmission line 201 uses a low-tapped termination, a combination of T<0:3>=1111 may cause the most current consumption in the signal transmission line 201, so the combination of T<0:3>=1111 might not map to a logic value of the first to third bits B<0:2>. In this case, a combination of T<0:3>=0000 may be mapped to one of logic values of the first to third bits B<0:2> in place of the combination of T<0:3>=1111.

FIG. 4 is a diagram illustrating a 5b3s mapping table according to an embodiment of the present disclosure. Referring to FIG. 4, the 5b3s mapping table may be used to encode five binary bits B<0:4> as three three-level symbols S11, S12, S13, or to decode three three-level symbols S11, S12, S13 as five binary bits B<0:4>. Hereinafter, encoding five binary bits as three three-level symbols may be referred to as 5b3s, and decoding three three-level symbols as five binary bits may be referred to as 3s5b. The five binary bits B<0:4> can have a total of 32 logic values, and the three three-level symbols S11, S12, S13 can have a total of 27 combinations. However, a combination of the three three-level symbols S11, S12, S13 where least significant bits T<0>, T<2>, T<4> and most significant bits T<1>, T<3>, T<5> are 0 might not be used, so there may be a total of 26 possible combinations of the three three-level symbols S11, S12, S13. Thus, six of logic values of the five binary bits B<0:4> might not map to any combination of the three three-level symbols S11, S12, S13. To increase the efficiency of data encoding and data decoding, and to simplify the hardware implementing data encoding and data decoding, the 5b3s mapping table may utilize the 3b2s mapping table illustrated in FIG. 3. The 5b3s mapping table may map logic values of the first and second bits B<0>, B<1> with a first symbol S11, and may map logic values of the third to fifth bits B<2>, B<3>, B<4> with a combination of the second and third symbols S12, S13. When the first and second bits B<0>, B<1> have a logic value of 00, the first and second bits B<0>, B<1> may be mapped to the first symbol S11 with a least significant bit T<0> and a most significant bit T<1> of 1. The logic values of the third to fifth bits B<2>, B<3>, B4> may be mapped to the combination of the second and third symbols S12, S13 according to a relationship of the 3b2s mapping table illustrated in FIG. 3. When the first and second bits B<0>, B<1> have a logic value of 01, the first and second bits B<0>, B<1> may be mapped to the first symbol S11 having the least significant bit T<0> of 1 and the most significant bit T<1> of 0. The logic values of the third to fifth bits B<2>, B<3>, B<4> may be mapped to the combination of the second and third symbols S12, S13 according to a relationship of the 3b2s mapping table illustrated in FIG. 3. When the first and second bits B<0>, B<1> have a logical value of 10, the first and second bits B<0>, B<1> may be mapped to the first symbol S11 having the least significant bit T<0> and the most significant bit T<1> of 0. The logic values of the third to fifth bits B<2>, B<3>, B<4> may be mapped to the combination of the second and third symbols S12, S13 according to a relationship of the 3b2s mapping table illustrated in FIG. 3.

When the first and second bits B<0>, B<1> have a logic value of 11, the first symbol S11 to which the first and second bits B<0>, B<1> may be mapped might not exist. Therefore, when the first and second bits B<0>, B<1> have a logic value of 11, an exceptional mapping relationship may be formed. When the third and fourth bits B<2>, B<3> have a logic value of 00, the logic value of the first to fifth bits B<0:4> may be mapped to a combination of the first to third symbols S11, S12, S13. When the first to fifth bits B<0:4> have a logic value of 11000, the first to fifth bits B<0:4> may be mapped to the first symbol S11 having the least significant bit T<0> of 1 and the most significant bit T<1> of 0, and to the second and third symbols S12, S13 having the least significant bits T<2>, T<4> and the most significant bits T<3>, T<5> of 0. When the first to fifth bits B<0:4> have a logic value of 11001, the first to fifth bits B<0:4> may be mapped to the first symbol S11 having the least significant bit T<0> and the most significant bit T<1> of 1, and to the second and third symbols S12, S13 having the least significant bits T<2>, T<4> and the most significant bits T<3>, T<5> of 0. The first to fifth bits B<0:4> having a logic value of 11010, 11011, 11100, 11101, 11110, or 11111 might not be mapped to any combination of the first to third symbols S11, S12, S13. To encode or decode the logic value of the first to fifth bits B<0:4> that does not map to a combination of the first to third symbols S11, S12, S13, a data encoding method and/or circuit and a data decoding method and/or circuit described below may be utilized. The 5b3s mapping table may include a 2b1s mapping table, and may be implemented with 2b1s encoding two binary bits as one three-level symbol or 1s2b decoding one three-level symbol as binary bits. At least two of the first to fifth bits B<0:4> may be mapped to at least one of the first to third symbols S11, S12, S13. For example, as indicated by the bold line boxes inside the 5b3s mapping table, the third and fourth bits B<2>, B<3> may be mapped according to the same rules as the second symbol S12. The third and fourth bits B<2>, B<3> having a logic value of 01 may be mapped to the second symbol S12 having the least significant bit T<2> and the most significant bit T<3> of 1. The third and fourth bits B<2>, B<3> having a logic value of 10 may be mapped to the second symbol S12 having the least significant bit T<2> and the most significant bit T<3> of 0. The third and fourth bits B<2>, B<3> having a logic value of 11 may be mapped to the second symbol S12 having the least significant bit T<2> of 1 and the most significant bit T<3> of 0. The 2b1s or 1s2b may be used to encode or decode a logic value of a first to fifth bits B<0:4> that does not map to a combination of the first to third symbols S11, S12, S13.

The 5b3s mapping table may assign a check signal CHK to specify a logic value of the first to fifth bits B<0:4> that does not map to a combination of the first to third symbols S11, S12, S13. For the first to fifth bits B<0:4> having logic values from 00000 to 11001, the check signal CHK having a first logic level may be assigned. For the first to fifth bits B<0:4> having logic values from 11010 to 11111, the check signal CHK having a second logic level may be assigned. The first logic level may be 0, and the second logic level may be 1. The check signal CHK may be generated by detecting a logic value of the first to fifth bits B<0:4> that does not map to a combination of the first to third symbols S11, S12, S13. For example, it may be generated based on a logic level of the first to fourth bits B<0:3>. A more detailed description of the check signal CHK is provided later.

FIG. 5 is a flowchart illustrating a data encoding method according to an embodiment of the present disclosure. The data encoding circuit 210 shown in FIG. 2A may encode first to eleventh bits TB<0:10> of the transmission data as first to seventh symbols S0 to S6 using the data encoding method. Referring to FIG. 5, at 310, 11 binary bits including first to eleventh bits b<0:10> may be received. At 320, the first to eleventh bits b<0:10> may be separated as three bit groups. The first to fifth bits b<0>, b<1>, b<2>, b<3>, b<4> may be set as a first bit group BG1. The sixth to eighth bits b<5>, b<6>, b<7> may be set as a second bit group BG2. The ninth to eleventh bits b<8>, b<9>, b<10> may be set as a third bit group BG3. Based on the first to fourth bits b<0>, b<1>, b<2>, b<3>, a check signal CHK may be generated. The check signal CHK may have a logic level that is changed according to a logic value of the first to fourth bits b<0>, b<1>, b<2>, b<3>. For example, the check signal CHK may be generated by a logical AND operation of a logic level of a first bit b<0>, a logic level of the second bit b<1>, and a logic level of one of the third and fourth bits b<2>, b<3>. When the logic levels of the first bit b<0> and the second bit b<1> are 1 and a logic level of at least one of the third and fourth bits b<2>, b<3> is 1, a logic level of the check signal CHK may be 1. When a logic level of at least one of the first and second bits b<0>, b<1> is 0, or when the logic levels of the third and fourth bits b<2>, b<3> are both 0, a logic level of the check signal CHK may be 0. When the first to eleventh bits b<0:10> are set as the first to third bit groups BG1, BG2, BG3 respectively and the check signal CHK is generated, the first to seventh symbols S0 to S6, t<0:13> may be generated by encoding the first to third bit groups BG1, BG2, BG3 based on the check signal CHK and the fifth bit b<4>. At 330, it may be determined whether a logic level of the check signal CHK is 1. If the logic level of the check signal CHK is 0 (when a result of 330 is 'no'), 340 may be performed, and if the logic level of the check signal CHK is 1 (when a result of 330 is 'yes'), 350 may be performed.

When a logic level of the check signal CHK is 0, a logic value of the first bit group BG1 may correspond to a case where it fully maps to a combination of the first to third symbols S0, S1, S2 by the 5b3s mapping table illustrated in FIG. 4. At 340, the first to fifth bits b<0>, b<1>, b<2>, b<3>, b<4> of the first bit group BG1 may be encoded as the first to third symbols S0, S1, S2, t<0:5> according to the 5b3s mapping table illustrated in FIG. 4. The second bit group BG2 may be encoded as the fourth and fifth symbols S3, S4, t<6:9> according to the 3b2s mapping table illustrated in FIG. 3. The third bit group BG3 may be encoded as the sixth and seventh symbols S5, S6, t<10:13> according to the 3b2s mapping table illustrated in FIG. 3.

When a logic level of the check signal CHK is 1, at 350, it may be determined whether a logic level of the fifth bit b<4> is 0. The logic level of the fifth bit b<0> may be used to identify a symbol being masked when encoding a logic value of the first to fifth bits b<0>, b<1>, b<2>, b<3>, b<4> that does not map to a combination of the first to third symbols S0, S1, S2. When a logic level of the fifth bit b<4> is 0 (when a result of 350 is 'no'), 360 may be performed, and when a logic level of the fifth bit b<4> is 1 (when a result of 350 is 'yes'), 370 may be performed. When a logic level of the fifth bit b<4> is 0, the fourth and fifth symbols S3, S4 may be masked, and when a logic level of the fifth bit b<4> is 1, the sixth and seventh symbols S5, S6 may be masked. For example, the masked symbols may have a least significant bit and a most significant bit corresponding to a first fixed value F1<0:3>. The first fixed value may be 0000, and the least significant and most significant bits of the masked symbols may be 0, and may be masked as a symbol of low state. In an embodiment, a data encoding method may be modified such that 370 is performed when a logic level of the fifth bit b<4> is 0, and 360 is performed when a logic level of the fifth bit b<4> is 1.

At 360, the third and fourth bits b<2>, b<3> of the first bit group BG1 may be encoded as the first symbol S0, t<0:1>. The third and fourth bits b<2>, b<3> may be encoded as one symbol according to the 2b1s mapping table included in the 5b3s mapping table illustrated in FIG. 4, and the encoded symbol may be provided as the first symbol S0, t<0:1>. The sixth to eighth bits b<5>, b<6>, b<7> of the second bit group BG2 may be encoded as the second and third symbols S1, S2, t<2:5>. The sixth to eighth bits b<5>, b<6>, b<7> may be encoded as two symbols according to the 3b2s mapping table illustrated in FIG. 3, and the encoded symbols may be provided as the second and third symbols S1, S2, t<2:5>. The fourth and fifth symbols S3, S4, t<6:9> may be masked, and least significant bits and most significant bits t<6:9> of the fourth and fifth symbols S3, S4 may be set with the first fixed value F1<0:3>. The ninth to eleventh bits b<8>, b<9>, b<10> of the third bit group BG3 may be encoded as the sixth and seventh symbols S5, S6. At 370, the ninth to eleventh bits b<8>, b<9>, b<10> may be encoded as two symbols according to the 3b2s mapping table illustrated in FIG. 3, and the encoded symbols may be provided as the sixth and seventh symbols S5, S6, t<10:13>.

At 370, the third and fourth bits b<2>, b<3> of the first bit group BG1 may be encoded as the first symbol S0, t<0:1>. The third and fourth bits b<2>, b<3> may be encoded as one symbol according to the 2b1s mapping table included in the 5b3s mapping table illustrated in FIG. 4, and the encoded symbol may be provided as the first symbol S0, t<0:1>. The sixth to eighth bits b<5>, b<6>, b<7> of the second bit group BG2 may be encoded as the second and third symbols S1, S2, t<2:5>. The sixth to eighth bits b<5>, b<6>, b<7> may be encoded as two symbols according to the 3b2s mapping table illustrated in FIG. 3, and the encoded symbols may be provided as the second and third symbols S1, S2, t<2:5>.

The ninth to eleventh bits b<8>, b<9>, b<10> of the third bit group BG3 may be encoded as the fourth and fifth symbols S3, S4, t<6:9>. The ninth to eleventh bits b<8>, b<9>, b<10> may be encoded as two symbols according to the 3b2s mapping table illustrated in FIG. 3, and the encoded symbols may be provided as the fourth and fifth symbols S3, S4, t<6:9>. The sixth and seventh symbols S5, S6, t<10:13> may be masked, and least significant bits and most significant bits t<10:13> of the sixth and seventh symbols S5, S6 may be set with the first fixed value F1<0:3>.

FIG. 6 is a flowchart illustrating a data decoding method according to an embodiment of the present disclosure. The data decoding circuit 220 shown in FIG. 2B may decode the first to seventh symbols S0 to S6 as first to eleventh bits RB<0:10> of the received data using the data decoding method. Referring to FIG. 6, seven symbols including the first to seventh symbols S0 to S6, t<0:13> may be received at 410. Each of the first to seventh symbols S0 to S6 may include a least significant bit and a most significant bit t<0:13>. At 420, the first to seventh symbols S0 to S6, t<0:13> may be separated as three symbol groups. The first to third symbols S0, S1, S2, t<0:5> may be set as a first symbol group SG1. The fourth and fifth symbols S3, S4, t<6:9> may be set as a second symbol group SG2. The sixth and seventh symbols S5, S6, t<10:13> may be set as a third symbol group SG3. A check signal CHK may be generated based on the least significant bits t<6>, t<8>, t<10>, t<10> of the fourth to seventh symbols S3, S4, S5, S6. The check signal CHK may have a logic level that is changed according to a logic level of the least significant bits t<6>, t<8>, t<10>, <10> of the fourth to seventh symbol S3, S4, S5, S6. For example, the check signal CHK may be generated by a logical AND operation of the least significant bits t<6>, t<8> of the fourth and fifth symbols S3, S4, a logical AND operation of the least significant bits t<10>, t<12> of the sixth and seventh symbols S5, S6, and a logical OR operation of the results of the logical AND operations. The check signal CHK may be generated by logical OR operation of a result of logical OR operation of inverted signals of the least significant bits ~t<6>, ~t<8> of the fourth and fifth symbols S3, S4 and a result of logical AND operation of inverted signals of the least significant bits ~t<10>, ~t<12> of the sixth and seventh symbols S5, S6. When the least significant bits t<6>, t<8> of the fourth and fifth symbols S3, S4 are 0 or the least significant bits t<10>, t<12> of the sixth and seventh symbols S5, S6 are 0, a logic level of the check signal CHK may be 1. When at least one of the least significant bits t<6>, t<8> of the fourth and fifth symbols S3, S4 is 1 and at least one of the least significant bits t<10>, t<12> of the sixth and seventh symbols S5, S6 is 1, a logic level of the check signal CHK may be 0. Once the check signal CHK is generated, the first to third symbol groups SG1, SG2, SG3 may be decoded based on the check signal CHK and logic levels of the least significant bits t<6>, t<8> of the fourth and fifth symbols S3, S4 to generate first to eleventh bits b<0:11>. At 430, it may be determined whether a logic level of the check signal CHK is 1. When the logic level of the check signal CHK is 0 (when a result of 430 is 'no'), 440 may be performed, and when the logic level of the check signal CHK is 1 (when a result of 430 is 'yes'), 450 may be performed.

When a logic level of the check signal CHK is 0, it may be a case that a combination of the first symbol group SG1 fully maps to logic values of the first to fifth bits b<0>, b<1>, b<2>, b<3>, b<4> by the 5b3s mapping table illustrated in FIG. 4. At 440, the first to third symbols S0, S1, S2, t<0:5> of the first symbol group SG1 may be decoded as the first to fifth bits b<0>, b<1>, b<2>, b<3>, b<4> according to the 5b3s mapping table illustrated in FIG. 4. The second symbol group SG2 may be decoded as the sixth to eighth bits b<5>, b<6>, b<7> according to the 3b2s mapping table illustrated in FIG. 3. The third symbol group SG3 may be decoded as the ninth to eleventh bits b<8>, b<9>, b<10> according to the 3b2s mapping table illustrated in FIG. 3.

When a logic level of the check signal CHK is 1, logic levels of the least significant bits t<10>, t<12> of the sixth and seventh symbols S5, S6 may be determined at 450. 450 may be performed to detect and/or identify a masked symbol in the data encoding method of FIG. 5. It may be determined whether a result of a logical AND operation of the least significant bits t<10>, t<12> of the sixth and seventh symbols S5, S6 is 0. When a logic level of at least one of the least significant bits t<10>, t<12> of the sixth and seventh symbols S5, S6 is 1 (when a result of 450 is 'no'), 460 may be performed, and when a logic level of the least significant bits t<10>, t<12> of the sixth and seventh symbols S5, S6 is 0 (when a result of 450 is 'yes'), 470 may be performed. At 460 and 470, logic levels of the first bit b<0> and the second bit b<1> may be set with 1. In an embodiment, the data decoding method may be modified such that 470 is performed when a logic level of at least one of the least significant bits t<10>, t<12> of the sixth and seventh symbols S5, S6 is 1, and 460 is performed when a logic level of the least significant bits t<10>, t<12> of the sixth and seventh symbols S5, S6 is 0.

At 460, a logic level of the fifth bit b<4> may be set with 0. The first symbol S0, t<0:1> may be decoded as the third and fourth bits b<2>, b<3>. The first symbol S0, t<0:1> may be decoded as the third and fourth bits b<2>, b<3> according to the 2b1s mapping table included in the 5b3s mapping table illustrated in FIG. 4. The first to third symbols S0, S1, S2, t<0:5> of the first symbol group SG1 may be decoded as the sixth to eighth bits b<5>, b<6>, b<7>. The first to third symbols S0, S1, S2, t<0:5> may be decoded as five decoding bits d<0:4> according to the 5b3s mapping table illustrated in FIG. 4, and three of the decoding bits d<0:4> may be provided as the sixth to eighth bits b<5>, <b6>, b<7>. The decoding bits d<2:4> may be provided as the sixth to eighth bits b<5>, b<6>, b<7>. The sixth and seventh symbols S5, S6, t<10:13> of the third symbol group SG3 may be decoded as the ninth to eleventh bits b<8>, b<9>, b<10>. The sixth and seventh symbols S5, S6, t<10:13> may be decoded as three bits according to the 3b2s mapping table illustrated in FIG. 3, and the three decoding bits may be provided as the ninth to eleventh bits b<8>, b<9>, b<10>.

At 470, a logic level of the fifth bit b<4> may be set with 1. The first symbol S0, t<0:1> may be decoded as the third and fourth bits b<2>, b<3>. The first symbol S0, t<0:1> may be decoded as the third and fourth bits b<2>, b<3> according to the 2b1s mapping table included in the 5b3s mapping table illustrated in FIG. 4. The first to third symbols S0, S1, S2, t<0:5> of the first symbol group SG1 may be decoded as the sixth to eighth bits b<5>, b<6>, b<7>. The first to third symbols S0, S1, S2, t<0:5> may be decoded as five decoding bits d<0:4> according to the 5b3s mapping table illustrated in FIG. 4, and three of the decoding bits d<0:4> may be provided as the sixth to eighth bits b<5>, <b6>, b<7>. The decoding bits d<2:4> may be provided as the sixth to eighth bits b<5>, b<6>, b<7>. The fourth and fifth symbols S3, S4, t<6:9> of the second symbol group SG2 may be decoded as the ninth to eleventh bits b<8>, b<9>, b<10>. The fourth and fifth symbols S3, S4, t<6:9> may be decoded as three bits according to the 3b2s mapping table illustrated in FIG. 3, and the decoded three bits may be provided as the ninth to eleventh bits b<8>, b<9>, b<10>.

Referring to FIGS. 1 to 5, a data encoding method and a data decoding operation according to an embodiment of the present disclosure will be described as follows.

1) When the First to Eleventh Bits TB<0:10> of the Transmission Data have a Logic Value of 01010111111.

The data encoding circuit 211 may set the first to fifth bits TB<0:4>=01010 as the first bit group BG1, the sixth to eighth bits TB<5:7>=111 as the second bit group BG2, and the ninth to eleventh bits TB<8:10>=111 as the third bit group BG3. Because the first bit TB<0> is 0, a logic level of the check signal CHK may be 0. Accordingly, the first to third bit groups BG1, BG2, BG3 may be encoded according to 340 of FIG. 5. The first to fifth bits TB<0:4> may be encoded as a first symbol S0, T<0:1>=10 with a least significant bit of 1 and a most significant bit of 0, and a second and third symbol S1, S2, T<2:5>=1111 with a least significant bit and a most significant bit of 1, respectively, according to the 5b3s mapping table of FIG. 4. The sixth to eighth bits TB<5:7> may be encoded as fourth and fifth symbols S3, S4, T<6:9>=1010 with a least significant bit of 1 and a most significant bit of 0, respectively, according to the 3b2s mapping table of FIG. 3. The ninth to eleventh bits TB<8:10> may be encoded as sixth and seventh symbols S5, S6, T<10:13>=1010 with a least significant bit of 1 and a most significant bit of 0, respectively, according to the 3b2s mapping table of FIG. 3. The transmitter 212 may transmit the multi-level signal MS based on the first to seventh symbols S0 to S6, T<0:13>=10111110101010.

The receiver 221 may receive the multi-level signal MS to restore the first to seventh symbols S0 to S6, T<0:13>=10111110101010. The data decoding circuit 222 may set the first to third symbols S0, S1, S2, T<0:5>=101111 as a first symbol group SG1, the fourth and fifth symbols S3, S4, T<6:9>=1010 as a second symbol group, and the sixth and seventh symbols S5, S6, T<10:13>=1010 as a third symbol group SG3. Because the least significant bits of the fourth to seventh symbols S4, S5, S6, S7 are all 1, a logic level of the check signal CHK may be 0. Accordingly, the first to third symbol groups SG1, SG2, SG3 may be decoded according to 440 of FIG. 6. The first to third symbols S1, S2, S3 may be decoded as first to fifth bits RB<0:4> of the received data having a logical value of 01010 according to the 5b3s mapping table of FIG. 4. The fourth and fifth symbols S3, S4 may be decoded as sixth to eighth bits RB<5:7> of the received data having a logical value of 111 according to the 3b2s mapping table of FIG. 3. The sixth and seventh symbols S5, S6 may be decoded as ninth to eleventh bits RB<8:10> of the received data having a logical value of 111 according to the 3b2s mapping table of FIG. 3. Thus, the first to eleventh bits RB<0:10>=01010111111 of the received data may have the same logic value as the first to eleventh bits TB<0:10> of the transmission data.

2) When the First to Eleventh Bits TB<0:10> of the Transmission Data have a Logic Value of 11100111111.

The data encoding circuit 211 may set the first to fifth bits TB<0:4>=11100 as the first bit group BG1, the sixth to eighth bits TB<5:7>=111 as the second bit group BG2, and the ninth to eleventh bits TB<8:10>=111 as the third bit group BG3. Because the first to third bits TB<0:2> are all 1, a logic level of the check signal CHK may be 1. Because the fifth bit TB<4> has a logic level of 0, the first to third bit groups BG1, BG2, BG3 may be encoded according to 360 of FIG. 5. Because a logic level of the third and fourth bits TB<2:3> is 10, the third and fourth bits TB<2:3> may be encoded as a symbol having a least significant bit and a most significant bit of 0 according to the 2b1s mapping table included in the 5b3s mapping table of FIG. 4, and the encoded symbol may be provided as the first symbol S0, T<0:1>=00. The sixth to eighth bits TB<5:7> are encoded as two symbols whose least significant bits are each 1 and whose most significant bits are each 0 according to the 3b2s mapping table of FIG. 3, and the encoded symbols may be provided as the second and third symbols S1, S2, T<2:5>=1010. The fourth and fifth symbols S3, S4, t<6:9> may be masked with the first fixed value F1<0:3>=0000, and a least significant bit and a most significant bit of the fourth and fifth symbols S3, S4 may be set with 0, respectively (T<6:9>=0000). The ninth to eleventh bits TB<8:10> may be encoded as the sixth and seventh symbols S5, S6, T<10:13>=1010 with a least significant bit of 1 and a most significant bit of 0, respectively, according to the 3b2s mapping table of FIG. 3. The transmitter 212 may transmit the multi-level signal MS based on the first to seventh symbols S0 to S6, T<0:13>=00101000001010.

The receiver 221 may receive the multi-level signal MS to restore the first to seventh symbols S0 to S6, T<0: 13>=00101000001010. The data decoding circuit 222 may set the first to third symbols S0, S1, S2, T<0:5>=001010 as the first symbol group SG1, and the fourth and fifth symbols S3, S4, T<6:9>=0000 as the second symbol group SG2, and the sixth and seventh symbols S5, S6, T<10:13>=1010 as the third symbol group SG3. Because the least significant bits of the fourth and fifth symbols S3, S4 are all 1, a logic level of the check signal CHK may be 1. Further, because the least significant bits of the sixth and seventh symbols S5, S6 are 1, the first to third symbol groups SG1, SG2, SG3 may be decoded according to 460 of FIG. 6. The first and second bits RB<0:1> of the received data may be set with 1 (RB<0:1>=11), and the fifth bit RB<4> may be set with 0 (RB<4>=0). The first symbol S0 may be decoded as third and fourth bits RB<2:3> of the received data according to the 2b1s mapping table included in the 5b3s mapping table of FIG. 4. Because a least significant bit T<0> and a most significant bit T<1> of the first symbol S0 are 0, the third and fourth bits RB<2:3> may have a logical value of 10. The first to third symbols S0, S1, S2 may be decoded as decoding bits d<0:4> having a logic value of 10111 according to the 5b3s mapping table of FIG. 4, and decoding bits d<2:4> among the decoding bits d<0:4> may be provided as the sixth to eighth bits RB<5:7> of the received data. Accordingly, the sixth to eighth bits RB<5:7> may have a logical value of 111. The sixth and seventh symbols S5, S6 may be decoded as ninth to eleventh bits RB<8:10> of the received data having a logical value of 111 according to the 3b2s mapping table of FIG. 3. Thus, the first to eleventh bits RB<0: 10>=11100111111 of the received data may have the same logic value as the first to eleventh bits TB<0:10> of the transmission data.

3) When the First to Eleventh Bits of the Transmission Data have a Logic Value of 11111111111.

The data encoding circuit 211 may set the first to fifth bits TB<0:4>=11111 as the first bit group BG1, the sixth to eighth bits TB<5:7>=111 as the second bit group BG2, and the ninth to eleventh bits TB<8:10>=111 as the third bit group BG3. Because the first to fourth bits TB<0:3> are 1, a logic level of the check signal CHK may be 1. Because the fifth bit TB<4> has a logic level of 1, the first to third bit groups BG1, BG2, BG3 may be encoded according to 370 of FIG. 5. Because the third and fourth bits TB<2:3> have a logic value of 11, the third and fourth bits TB<2:3> may be encoded as a symbol with a least significant bit of 1 and a most significant bit of 0 according to the 5b3s mapping table of FIG. 4, and the encoded symbol may be provided as the first symbol S0, T<0:1>=10. The sixth to eighth bits TB<5:7> are encoded as two symbols whose least significant bits are each 1 and whose most significant bits are each 0 according to the 3b2s mapping table of FIG. 3, and the encoded symbols may be provided as the second and third symbols S1, S2, T<2:5>=1010. The ninth to eleventh bits TB<8:10> may be encoded as fourth and fifth symbols S3, S4, T<6:9>=1010 whose least significant bits are each 1 and whose most significant bits are each 0 according to the 3b2s mapping table of FIG. 3. The sixth and seventh symbols S5, S6, t<10:13> may be masked with the first fixed value F1<0:3>=0000, and a least significant bit and a most significant bit of the sixth and seventh symbols S5, S6 may be set to 0, respectively (T<10:13>=0000). The transmitter 212 may transmit the multi-level signal MS based on the first to seventh symbols S0 to S6, T<0:13>=10101010100000.

The receiver 221 may receive the multi-level signal MS to restore the first to seventh symbols S0 to S6, T<0: 13>=10101010100000. The data decoding circuit 222 may set the first to third symbols S0, S1, S2, T<0:5>=101010 as a first symbol group SG1, and set the fourth and fifth symbols S3, S4, T<6:9>=1010 as a second symbol group SG2, and the sixth and seventh symbols S5, S6, T<10: 13>=0000 as a third symbol group SG3. Because the least significant bits of the sixth and seventh symbols S5, S6 are 0, a logic level of the check signal CHK may be 1. Thus, the first to third symbol groups SG1, SG2, SG3 may be decoded according to 470 of FIG. 6. The first and second bits RB<0:1> of the received data may be set to 1. The fifth bit RB<4> of the received data may also be set to 1. The first symbol S0, T<0:1>=10 may be decoded as the third and fourth bits RB<2:3> of the received data according to the 2b1s mapping table included in the 5b3s mapping table of FIG. 4. Because a least significant bit of the first symbol S0 is 1 and a most significant bit is 0, the third and fourth bits RB<2:3> may have a logical value of 11. The first to third symbols S0, S1, S2, T<0:5>=101010 are decoded as decoding bits d<0:4> of a logical value of 01111 according to the 5b3s mapping table of FIG. 4, and decoding bits d<2:4> among the decoding bits d<0:4> may be decoded as the sixth to eighth bits RB<5:7> of the received data. Accordingly, the sixth to eighth bits RB<5:7> may have a logical value of 111. The fourth and fifth symbols S3, S4, T<6:9>=1010 may be decoded as ninth to eleventh bits RB<8:10> of the received data having a logical value of 111 according to the 3b2s mapping table of FIG. 3. Thus, the first to eleventh bits RB<0:10>=11111111111 of the received data may have the same logic value as the first to eleventh bits TB<0:10> of the transmission data.

Figure 7:
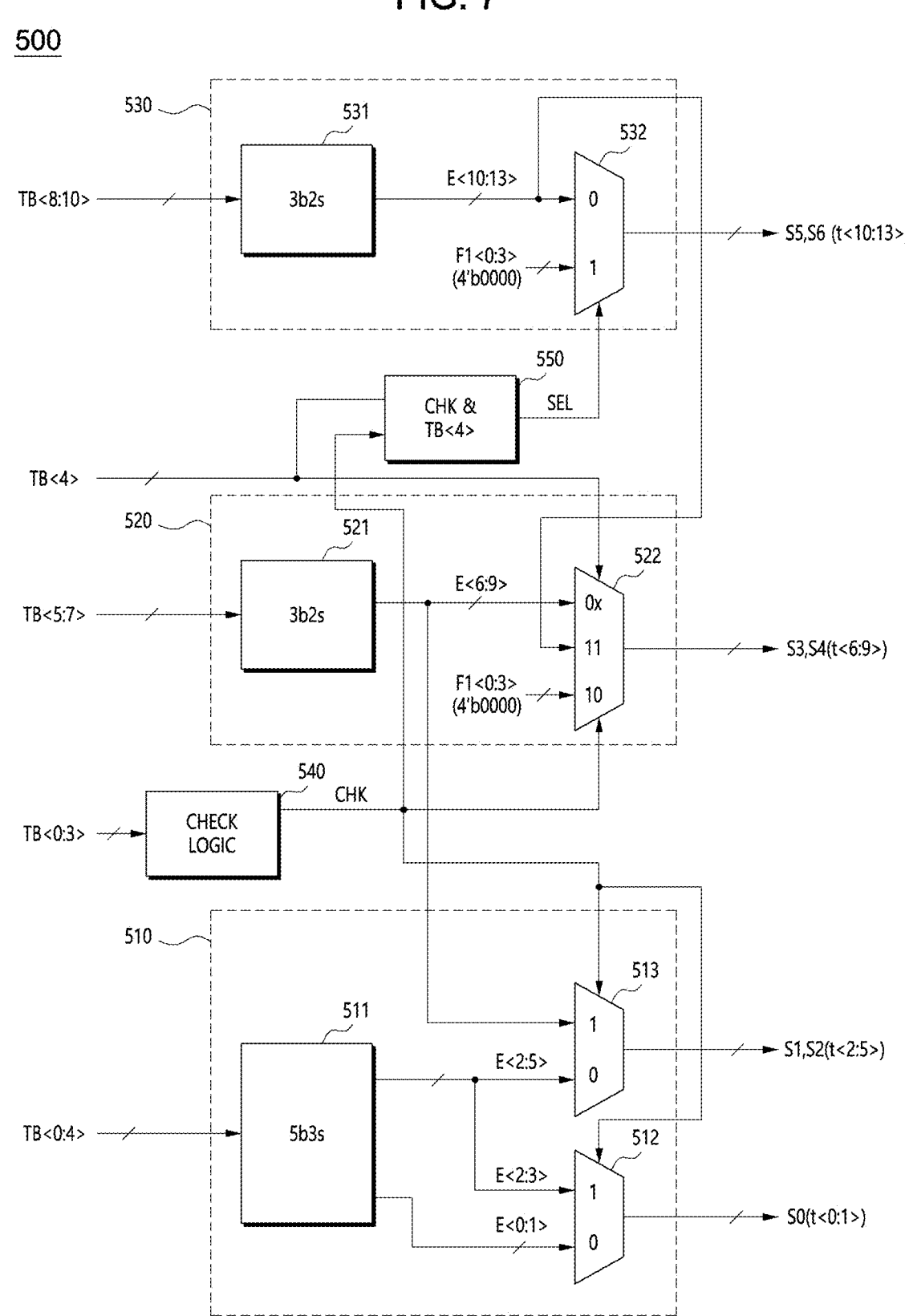
FIG. 7 is a diagram illustrating a configuration of a data encoding circuit according to an embodiment.

FIG. 7 is a diagram illustrating a configuration of a data encoding circuit 500 according to an embodiment of the present disclosure. The data encoding circuit 500 may implement the data encoding method shown in FIG. 5. Referring to FIG. 7, the data encoding circuit 500 may include a first encoding circuit 510, a second encoding circuit 520, a third encoding circuit 530, a check logic circuit 540, and a selection logic circuit 550. The first encoding circuit 510 may receive first to fifth bits TB<0:4> of the transmission data. The first encoding circuit 510 may encode the first to fifth bits TB<0:4> to generate first to sixth encoding bits E<0:5>. The first encoding circuit 510 may receive a check signal CHK from the check logic circuit 540, and may receive seventh to tenth encoding bits E<6:9> from the second encoding circuit 520. The first encoding circuit 510 may output one of first and second encoding bits E<0:1> and third and fourth encoding bits E<2:3> as a first symbol S0, t<0:1> based on the check signal CHK. The first encoding circuit 510 may provide the first and second encoding bits E<0:1> as a least significant bit t<0> and a most significant bit t<1> of the first symbol S0, or may provide the third and fourth encoding bits E<2:3> as a least significant bit t<0> and a most significant bit t<1> of the first symbol S0, according to a logic level of the check signal CHK. The first encoding circuit 510 may output one of third to sixth encoding bits E<2:5> and seventh to tenth encoding bits E<6:9> as second and third symbols S1, S2 (t<2:5>) based on the check signal CHK. The first encoding circuit 510 may sequentially provide the third to sixth encoding bits E<2:5> as a least significant bit t<2> and a most significant bit t<3> of the second symbol S1 and a least significant bit t<4> and a most significant bit t<5> of the third symbol S2, or may sequentially provide the seventh to tenth encoding bits E<6:9> as a least significant bit t<2> and a most significant bit t<3> of the second symbol S1 and a least significant bit t<4> and a most significant bit t<5> of the third symbol S2, according to a logic level of the check signal CHK.

The second encoding circuit 520 may receive the sixth to eighth bits TB<5:7> of the transmission data. The second encoding circuit 520 may encode the sixth to eighth bits TB<5:7> to generate the seventh to tenth encoding bits E<6:9>. The second encoding circuit 520 may receive the check signal CHK and the fifth bit TB<4> of the transmission data, and may receive eleventh to fourteenth encoding bits E<10:13> from the third encoding circuit 530. Based on the check signal CHK and the fifth bit TB<4>, the second encoding circuit 520 may output one of the seventh to tenth encoding bits E<6:9>, the eleventh to fourteenth encoding bits E<10:13> and a first fixed value F1<0:3> as fourth and fifth symbols S3, S4 (t<6:9>). The first fixed value F1<0:3> may be a logic value that masks the fourth and fifth symbols S3, S4, and may have a logic value of 0000, for example. The second encoding circuit 520 may sequentially provide the seventh to tenth encoding bits E<6:9> as a least significant bit t<6> and a most significant bit t<7> of the fourth symbol S3 and a least significant bit t<8> and a most significant bit t<9> of the fifth symbol S4, may sequentially provide the eleventh to fourteenth encoding bits E<10:13> as a least significant bit t<6> and a most significant bit t<7> of the fourth symbol S3 and a least significant bit t<8> and a most significant bit t<9> of the fifth symbol S4, or may mask the least significant bits t<6>, t<8> and the most significant bits t<7>, t<9> of the fourth and fifth symbols S3, S4 with the first fixed value F1<0:3>, according to logic levels of the check signal CHK and the fifth bit TB<4>.

The third encoding circuit 530 may receive ninth to eleventh bits TB<8:10> of the transmission data. The third encoding circuit 530 may encode the ninth to eleventh bits TB<8:10> to generate the eleventh to fourteenth encoding bits E<10:13>. The third encoding circuit 530 may receive a selection signal SEL from the selection logic circuit 550. Based on the selection signal SEL, the third encoding circuit 530 may output one of the eleventh to fourteenth encoding bits E<10:13> and the first fixed value F1<0:3> as the sixth and seventh symbols S5, S6 (t<10:13>). The third encoding circuit 530 may sequentially provide the eleventh to fourteenth encoding bits E<10:13> as a least significant bit t<10> and a most significant bit t<11> of the sixth symbol S5 and a least significant bit t<12> and a most significant bit t<13> of the seventh symbol S6, or may mask the least significant bits t<10>, t<12> and the most significant bits t<11>, t<13> of the sixth and seventh symbols S5, S6 with the first fixed value F1<0:3>.

The check logic circuit 540 may receive the first to fourth bits TB<0:3> of the transmission data. The check logic circuit 540 may generate the check signal CHK based on the first to fourth bits TB<0:3>. The check logic circuit 540 may change a logic level of the check signal CHK based on a logic level of the first to fourth bits TB<0:3>. The check logic circuit 540 may generate the check signal CHK having a first logic level when at least one of the first and second bits TB<0>, TB<1> is 0 or when the third and fourth bits TB<2>, TB<3> are 0. The check logic circuit 540 may generate the check signal CHK having a second logic level when the first and second bits TB<0>, TB<1> are 1 and at least one of the third and fourth bits TB<2>, TB<3> is 1. The first logic level may be 0, and the second logic level may be 1.

The selection logic circuit 550 may receive the check signal CHK from the check logic circuit 540, and may receive the fifth bit TB<4> of the transmission data. The selection logic circuit 550 may generate the selection signal SEL having a first logic level when at least one of the check signal CHK and the fifth bit TB<4> is 0. The selection logic circuit 550 may generate the selection signal SEL having a second logic level when the check signal CHK and the fifth bit TB<4> are 1.

The first encoding circuit 510 may include a first encoder 511, a first selection circuit 512, and a second selection circuit 513. The first encoder 511 may receive the first to fifth bits TB<0:4> of the transmission data, and may encode the first to fifth bits TB<0:4> to generate the first to sixth encoding bits E<0:5>. The first encoder 511 may include a 5b3s encoder. The first encoder 511 may perform an encoding operation according to the 5b3s mapping table illustrated in FIG. 4 to map the first to fifth bits TB<0:4> with the first to sixth encoding bits E<0:5>.

The first selection circuit 512 may receive the first and second encoding bits E<0:1> and the third and fourth encoding bits E<2:3> from the first encoder 511. The first selection circuit 512 may receive the check signal CHK from the check logic circuit 540. Based on the check signal CHK, the first selection circuit 512 may output the first and second encoding bits E<0:1> as the first symbol S0, t<0:1> or may output the third and fourth encoding bits E<2:3> as the first symbol S0, t<0:1>. When the check signal CHK has a first logic level, the first selection circuit 512 may provide the first and second encoding bits E<0:1> as a least significant bit t<0> and a most significant bit t<1> of the first symbol S0. When the check signal CHK has a second logic level, the first selection circuit 512 may provide the third and fourth encoding bits E<2:3> as a least significant bit t<0> and a most significant bit t<1> of the first symbol S0.

The second selection circuit 513 may receive the third to sixth encoding bits E<2:5> from the first encoder 511, and may receive the seventh to tenth encoding bits E<6:9> from the second encoding circuit 520. The second selection circuit 513 may receive the check signal CHK from the check logic circuit 540. Based on the check signal CHK, the second selection circuit 513 may output the third to sixth encoding bits E<2:5> as the second and third symbols S1, S2, t<2:5>, or may output the seventh to tenth encoding bits E<6:9> as the second and third symbols S1, S2 (t<2:5>). When the check signal CHK has a first logic level, the second selection circuit 513 may sequentially provide the third to sixth encoding bits E<2:5> as a least significant bit t<2> and a most significant bit t<3> of the second symbol S1 and a least significant bit t<4> and a most significant bit t<5> of the third symbol S2. When the check signal CHK has a second logic level, the second selection circuit 513 may sequentially provide the seventh to tenth encoding bits E<6:9> as a least significant bit t<2> and the most significant bit t<3> of the second symbol S1 and a least significant bit t<4> and a most significant bit t<5> of the third symbol S2.

The second encoding circuit 520 may include a second encoder 521 and a third selection circuit 522. The second encoder 521 may receive the sixth to eighth bits TB<5:7> of the transmission data, and may encode the sixth to eighth bits TB<5:7> to generate the seventh to tenth encoding bits E<6:9>. The second encoder 520 may include a 3b2s encoder. The second encoder 520 may perform encoding operation according to the 3b2s mapping table illustrated in FIG. 3 to map the sixth to eighth bits TB<5:7> to the seventh to tenth encoding bits E<6:9>.

The third selection circuit 522 may receive the seventh to tenth encoding bits E<6:9> from the second encoder 521, and may receive the eleventh to fourteenth encoding bits E<10:13> from the third encoding circuit 530. The third selection circuit 522 may receive the check signal CHK from the check logic circuit 540, and may receive the fifth bit TB<4> of the transmission data. Based on the check signal CHK and the fifth bit TB<4>, the third selection circuit 522 may output the seventh to tenth encoding bits E<6:9> as the fourth and fifth symbols S3, S4 (t<6:9>), may output the eleventh to fourteenth encoding bits E<10:13> as the fourth and fifth symbols S3, S4 (t<6:9>), or may output the first fixed value F1<0:3> as the fourth and fifth symbols S3, S4 (t<6:9>). When the check signal CHK has a first logic level, the third selection circuit 522 may sequentially provide the seventh to tenth encoding bits E<6:9> as a least significant bit t<6> and a most significant bit t<7> of the fourth symbol S3 and a least significant bit t<8> and a most significant bit t<9> of the fifth symbol S4. When the check signal CHK has a second logic level and the fifth bit TB<4> has a first logic level, the third selection circuit 522 may provide the first fixed value F1<0:3> to the fourth and fifth symbols S3, S4 (t<6:9>), thereby masking the fourth and fifth symbols S3, S4 (t<6:9>). When the check signal CHK and the fifth bit TB<4> have a second logic level, the third selection circuit 522 may sequentially provide the eleventh to fourteenth encoding bits E<10:13> as a least significant bit t<6> and a most significant bit t<7> of the fourth symbol S3 and a least significant bit t<8> and a most significant bit t<9> of the fifth symbol S4.

The third encoding circuit 530 may include a third encoder 531 and a fourth selection circuit 532. The third encoder 531 may receive the ninth to eleventh bits TB<8:10> of the transmission data, and may encode the ninth to eleventh bits TB<8:10> to generate the eleventh to fourteenth encoding bits E<10:13>. The third encoder 531 may include a 3b2s encoder. The third encoder 531 may perform encoding operation according to the 3b2s mapping table illustrated in FIG. 3 to map the ninth to eleventh bits TB<8:10> to the eleventh to fourteenth encoding bits E<10:13>.

The fourth selection circuit 532 may receive the selection signal SEL from the selection logic circuit 550. Based on the selection signal SEL, the fourth selection circuit 532 may output the eleventh to fourteenth encoding bits E<10:13> as the sixth and seventh symbols S5, S6 (t<10:13>), or may output the first fixed value F1<0:3> as the sixth and seventh symbols S5, S6 (t<10:13>). When the selection signal SEL has a first logic level, the fourth selection circuit 532 may sequentially provide the eleventh to fourteenth encoding bits E<10:13> as a least significant bit t<10> and a most significant bit t<11> of the sixth symbol S5 and a least significant bit t<12> and a most significant bit t<13> of the seventh symbol S6. When the selection signal SEL has a second logic level, the fourth selection circuit 532 may mask the sixth and seventh symbols S5, S6 (t<10:13>) by providing the first fixed value F1<0:3> to the sixth and seventh symbols S5, S6 (t<10:13>).

Because the first encoder 511 is configured to perform encoding operation according to the 5b3s mapping table shown in FIG. 4, and the 5b3s mapping table utilizes the 3b2s mapping table shown in FIG. 3, the first encoder 511 may be implemented by adding some logic circuits to the second and third encoders 521, 531. Thus, the cost of designing and manufacturing the first to third encoders 511, 521, 531 may be reduced, and the hardware cost and circuit area of the data encoding circuit 500, a transmitter circuit, and a semiconductor apparatus including the data encoding circuit 500 may be optimized. Furthermore, because the first to third encoding circuits 510, 520, 530 generate symbols through one encoder and one selection circuit, respectively, a delay time of a path in which the first to seventh symbols S0 to S6 are generated from the first to eleventh bits TB<0:10> can be matched, and an output skew can be reduced.

Figure 8:
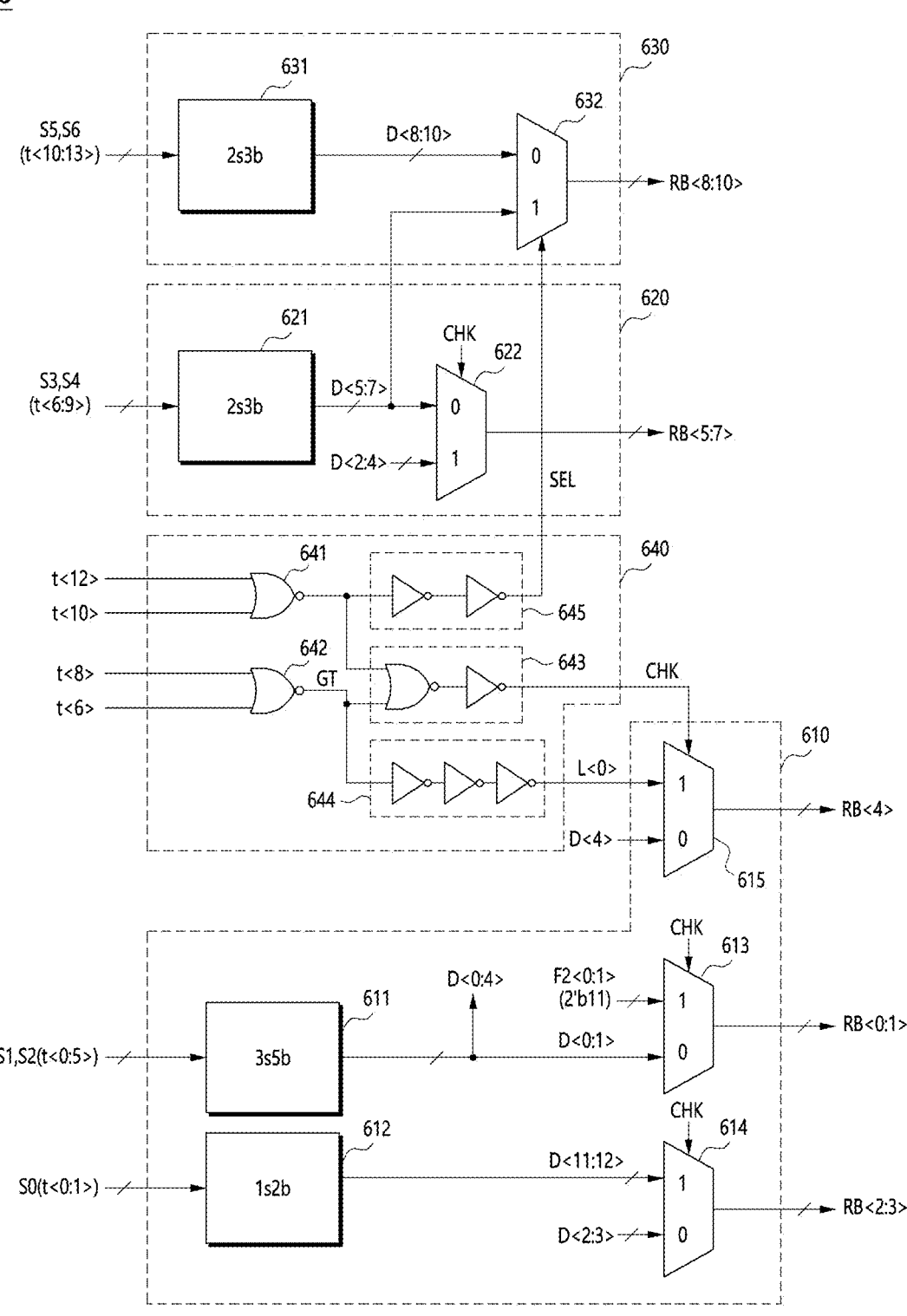
FIG. 8 is a diagram illustrating a configuration of a data decoding circuit according to an embodiment.

FIG. 8 is a diagram illustrating a configuration of a data decoding circuit 600 according to an embodiment of the present disclosure. The data decoding circuit 600 may implement the data decoding method shown in FIG. 6. Referring to FIG. 8, the data decoding circuit 600 may include a first decoding circuit 610, a second decoding circuit 620, a third decoding circuit 630, and a control logic circuit 640. The first decoding circuit 610 may receive the first to third symbols S0, S1, S2 (t<0:5>). The first decoding circuit 610 may decode the first to third symbols S0, S1, S2 (t<0:5>) to generate first to fifth bits RB<0:4> of the received data. The first decoding circuit 610 may decode least significant bits t<0>, t<2>, t<4> and most significant bits t<1>, <3>, <5> of the first to third symbols S0, S1, S2 to generate first to fifth decoding bits D<0:4> and twelfth and thirteenth decoding bits D<11:12>. The first decoding circuit 610 may decode the first to third symbols S0, S1, S2 (t<0:5>) to generate the first to fifth decoding bits D<0:4>, and may decode the first symbol S0 (t<0:1>) to generate the twelfth and thirteenth bits D<11:12>. The first decoding circuit 610 may receive a check signal CHK from the control logic circuit 640. Based on the check signal CHK, the first decoding circuit 610 may output one of the first and second decoding bits D<0:1> and a second fixed value F2<0:1> as the first and second bits RB<0:1>. The second fixed value F2<0:1> may have a logic value that masks the first and second bits RB<0:1>, for example, the second fixed value F2<0:1> may have a logic value of 11. The first decoding circuit 610 may provide the first and second decoding bits D<0:1> as the first and second bits RB<0:1>, or mask the first and second bits RB<0:1> with the second fixed value F2<0:1>, according to a logic level of the check signal CHK. The first decoding circuit 610 may output one of third and fourth decoding bits D<2:3> and the twelfth and thirteenth decoding bits D<11:12> as the third and fourth bits RB<2:3> based on the check signal CHK. The first decoding circuit 610 may provide the third and fourth decoding bits D<2:3> as the third and fourth bits RB<2:3>, or may provide the twelfth and thirteenth decoding bits D<11:12> as the third and fourth bits RB<2:3>, according to a logic level of the check signal CHK. The first decoding circuit 610 may output one of a fifth decoding bit D<4> and a logic bit L<0> as the fifth bit RB<4> based on the check signal CHK. The logic bit L<0> may be provided from the control logic circuit 640. The first decoding circuit 610 may provide the fifth decoding bit D<4> as the fifth bit RB<4>, or may provide the logic bit L<0> as the fifth bit RB<4>, according to a logic level of the check signal CHK.

The second decoding circuit 620 may receive the fourth and fifth symbols S3, S4 (t<6:9>). The second decoding circuit 620 may decode the fourth and fifth symbols S3, S4 (t<6:9>) to generate sixth to eighth bits RB<5:7> of the received data. The second decoding circuit 620 may decode least significant bits t<6>, t<8> and most significant bits t<7>, t<9> of the fourth and fifth symbols S3, S4 to generate sixth to eighth decoding bits D<5:7>. The second decoding circuit 620 may receive the third to fifth decoding bits D<2:4> from the first decoding circuit 610, and may receive the check signal CHK from the control logic circuit 540. Based on the check signal CHK, the second decoding circuit 620 may output one of the sixth to eighth decoding bits D<5:7> and the third to fifth decoding bits D<2:4> as the sixth to eighth bits RB<5:7>. The second decoding circuit 620 may provide the sixth to eighth decoding bits D<5:7> as the sixth to eighth bits RB<5:7>, or may provide the third to fifth decoding bits D<2:4> as the sixth to eighth bits RB<5:7>, according to a logic level of the check signal CHK.

The third decoding circuit 630 may receive the sixth and seventh symbols S5, S6 (t<10:13>). The third decoding circuit 630 may decode the sixth and seventh symbols S5, S6 (t<10:13>) to generate ninth to eleventh bits RB<8:10> of the received data. The third decoding circuit 630 may decode least significant bits t<10>, t<12> and most significant bits t<11>, t<13> of the sixth and seventh symbols S5, S6 to generate ninth to eleventh decoding bits D<8:10>. The third decoding circuit 630 may receive the sixth to eighth decoding bits D<5:7> from the second decoding circuit 620, and may receive a selection signal SEL from the control logic circuit 640. Based on the selection signal SEL, the third decoding circuit 630 may output one of the ninth to eleventh decoding bit D<8:10> and the sixth to eighth decoding bits D<5:7> as the ninth to eleventh bits RB<8:10>. The third decoding circuit 630 may provide the ninth to eleventh decoding bit D<8:10> as the ninth to eleventh bits RB<8:10>, or may provide the sixth to eighth decoding bits D<5:7> as the ninth to eleventh bits RB<8:10>, according to a logic level of the check signal CHK.

The control logic circuit 640 may receive least significant bits t<6>, t<8>, t<10>, <12> of the fourth to seventh symbols S3, S4, S5, S6. The control logic circuit 640 may generate the check signal CHK, the logic bit L<0>, and the selection signal SEL based on the least significant bits t<6>, t<8>, t<10>, t<12> of the fourth to seventh symbols S3, S4, S5, S6. The control logic circuit 640 may generate the check signal CHK based on the least significant bits t<6>, t<8>, t<10>, <12> of the fourth to seventh symbols S3, S4, S5, S6. The control logic circuit 640 may generate the check signal CHK having a second logic level when all of the least significant bits t<6>, <8> of the fourth and fifth symbols S3, S4 are at a first logic level, or when all of the least significant bits t<10>, t<12> of the sixth and seventh symbols S5, S6 are at a first logic level. The control logic circuit 640 may generate the check signal CHK having a first logic level when at least one of the least significant bits t<6>, t<8> of the fourth and fifth symbols S3, S4 is at a second logic level, or when at least one of the least significant bits t<10>, t<12> of the sixth and seventh symbols S5, S6 is at a second logic level. The control logic circuit 640 may generate the logic bit L<0> based on the least significant bits t<6>, t<8> of the fourth and fifth symbols S3, S4. The control logic circuit 640 may generate the logic bit L<0> having a first logic level when the least significant bits t<6>, t<8> of the fourth and fifth symbols S3, S4 are both at a first logic level. The control logic circuit 640 may generate the logic bit L<0> having a second logic level when at least one of the least significant bits t<6>, t<8> of the fourth and fifth symbols S3, S4 is at a second logic level. The control logic circuit 640 may generate the selection signal SEL based on the least significant bits t<10>, t<12> of the sixth and seventh symbols S5, S6. The control logic circuit 640 may generate the selection signal SEL having a second logic level when the least significant bits t<10>, t<12> of the sixth and seventh symbols S5, S6 are both at a first logic level. The control logic circuit 640 may generate the selection signal SEL having a first logic level when at least one of the least significant bits t<10>, t<12> of the sixth and seventh symbols S5, S6 is at a second logic level.

The first decoding circuit 610 may include a first decoder 611, a second decoder 612, a first selection circuit 613, a second selection circuit 614, and a third selection circuit 615. The first decoder 611 may receive the first to third symbols S0, S1, S2 (t<0:5>), decode the least significant bits t<0>, t<2>, t<4> and the most significant bits t<1>, t<3>, t<5> of the first to third symbols S0, S1, S2 to generate the first to fifth decoding bits D<0:4>. The first decoder 611 may include a 3s5b decoder. The first decoder 611 may perform decoding operation according to the 5b3s mapping table illustrated in FIG. 4 to map the least significant bits t<0>, t<2>, t<4> and the most significant bits t<1>, t<3>, t<5> of the first to third symbols S0, S1, S2 to the first to fifth decoding bits D<0:4>.

The second decoder 612 may receive the first symbol S0 (t<0:1>), and may decode the least significant bit t<0> and the most significant bit t<1> of the first symbol S0 to generate the twelfth and thirteenth decoding bits D<11:12>. The second decoder 612 may include a 1s2b decoder. The second decoder 612 may perform decoding operation according to the 2b1s mapping table included in the 5b3s mapping table illustrated in FIG. 4 to map the least significant bit t<0> and the most significant bit t<1> of the first symbol S0 to the twelfth and thirteenth decoding bits D<11:12>. In an embodiment, the second decoder 612 may be integrated to the first decoder 611, and the integrated decoder may be configured to independently output the first to fifth decoding bits D<0:4> and the twelfth and thirteenth decoding bits D<11:12>.

The first selection circuit 613 may receive the first and second decoding bits D<0:1> from the first decoder 611, and may receive the second fixed value F2<0:1>. The first selection circuit 613 may receive the check signal CHK from the control logic circuit 640. Based on the check signal CHK, the first selection circuit 613 may output the first and second decoding bits D<0:1> as the first and second bits RB<0:1>, or may output the second fixed value F2<0:1> as the first and second bits RB<0:1>. When the check signal CHK has a first logic level, the first selection circuit 613 may provide the first and second decoding bits D<0:1> as the first and second bits RB<0:1>. When the check signal CHK has a second logic level, the first selection circuit 613 may provide the second fixed value F2<0:1> as the first and second bits RB<0:1>.

The second selection circuit 614 may receive the third and fourth decoding bits D<2:3> from the first decoder 611, and may receive the twelfth and thirteenth decoding bits D<11:12> from the second decoder 612. The second selection circuit 614 may receive the check signal CHK from the control logic circuit 640. Based on the check signal CHK, the second selection circuit 614 may output the third and fourth decoding bits D<2:3> as the third and fourth bits RB<2:3>, or may output the twelfth and thirteenth decoding bits D<11:12> as the third and fourth bits RB<2:3>. When the check signal CHK has a first logic level, the second selection circuit 614 may provide the third and fourth decoding bits D<2:3> as the third and fourth bits RB<2:3>. When the check signal CHK has a second logic level, the second selection circuit 614 may provide the twelfth and thirteenth bits D<11:12> as the third and fourth bits RB<2: 3>.

The third selection circuit 615 may receive the fifth decoding bit D<4> from the first decoder 611, and may receive the check signal CHK and the logic bit L<0> from the control logic circuit 640. Based on the check signal CHK, the third selection circuit 615 may output the fifth decoding bit D<4> as the fifth bit RB<4>, or may output the logic bit L<0> as the fifth bit RB<4>. When the check signal CHK has a first logic level, the third selection circuit 615 may provide the fifth decoding bit D<4> as the fifth bit RB<4>. When the check signal CHK has a second logic level, the third selection circuit 615 may provide the logic bit L<0> as the fifth bit RB<4>.

The second decoding circuit 620 may include a third decoder 621 and a fourth selection circuit 622. The third decoder 621 may receive the fourth and fifth symbols S3, S4 (t<6:9>), and decode the least significant bits t<6>, t<8> and the most significant bits t<7>, t<9> of the fourth and fifth symbols S3, S4 to generate the sixth to eighth decoding bits D<5:7>. The third decoder 621 may include a 2s3b decoder. The third decoder 621 may perform decoding operation according to the 3b2s mapping table illustrated in FIG. 3 to map the least significant bits t<6>, t<8> and the most significant bits t<7>, t<9> of the fourth and fifth symbols S3, S4 with the sixth to eighth decoding bits D<5:7>.

The fourth selection circuit 622 may receive the sixth to eighth decoding bits D<5:7> from the third decoder 621, and may receive the third to fifth decoding bits D<2:4> from the first decoder 611. The fourth selection circuit 622 may receive the check signal CHK from the control logic circuit 640. Based on the check signal CHK, the fourth selection circuit 622 may output the sixth to eighth decoding bits D<5:7> as the sixth to eighth bits RB<5:7>, or may output the third to fifth decoding bits D<2:4> as the sixth to eighth bits RB<5:7>. When the check signal CHK has a first logic level, the fourth selection circuit 622 may provide the sixth to eighth decoding bits D<5:7> as the sixth to eighth bits RB<5:7>. When the check signal CHK has a second logic level, the fourth selection circuit 622 may provide the third to fifth decoding bits D<2:4> as the sixth to eighth bits RB<5:7>.

The third decoding circuit 630 may include a fourth decoder 631 and a fifth selection circuit 632. The fourth decoder 631 may receive the sixth and seventh symbols S5, S6 (t<10:13>), and decode the least significant bits t<10>, t<12> and the most significant bits t<11>, t<13> of the sixth and seventh symbols S5, S6 to generate the ninth to eleventh decoding bits D<8:10>. The fourth decoder 631 may include a 2s3b decoder. The fourth decoder 631 may perform decoding operation according to the 3b2s mapping table illustrated in FIG. 3 to map the least significant bits t<10>, t<12> and the most significant bits t<11>, <13> of the sixth and seventh symbols S5, S6 with the ninth to eleventh decoding bits D<8:10>.

The fifth selection circuit 632 may receive the ninth to eleventh decoding bits D<8:10> from the fourth decoder 631, and may receive the sixth to eighth decoding bits D<5:7> from the third decoder 621. The fifth selection circuit 632 may receive the selection signal SEL from the control logic circuit 640. Based on the selection signal SEL, the fifth selection circuit 632 may output the ninth to eleventh decoding bits D<8:10> as the ninth to eleventh bits RB<8:10>, or may output the sixth to eighth decoding bits D<5:7> as the ninth to eleventh bits RB<8:10>. When the selection signal SEL has a first logic level, the fifth selection circuit 632 may provide the ninth to eleventh decoding bits D<8:10> as the ninth to eleventh bits RB<8:10>. When the selection signal SEL has a second logic level, the fifth selection circuit 632 may provide the sixth to eighth decoding bits D<5:7> as the ninth to eleventh bits RB<8:10>.

The control logic circuit 640 may include a first logic gating circuit 641, a second logic gating circuit 642, a third logic gating circuit 643, and a fourth logic gating circuit 644. The first logic gating circuit 641 may receive the least significant bits t<10>, t<12> of the sixth and seventh symbols S5, S6, and generate the selection signal SEL based on the least significant bits t<10>, <12> of the sixth and seventh symbols S5, S6. The first logic gating circuit 641 may generate the selection signal SEL having a second logic level when the least significant bits t<10>, t<12> of the sixth and seventh symbols S5, S6 both have a first logic level. The first logic gating circuit 641 may generate the selection signal SEL having a first logic level when at least one of the least significant bits t<10>, t<12> of the sixth and seventh symbols S5, S6 has a second logic level. The first logic gating circuit 641 may be implemented with a NOR gate. The second logic gating circuit 642 may receive the least significant bits t<6>, t<8> of the fourth and fifth symbols S3, S4, and generate a gating signal GT based on the least significant bits t<6>, t<8> of the fourth and fifth symbols S3, S4. The second logic gating circuit 642 may generate the gating signal GT having a second logic level when the least significant bits t<6>, t<8> of the fourth and fifth symbols S3, S4 both have a first logic level. The second logic gating circuit 642 may generate the gating signal GT having a first logic level when at least one of the least significant bits t<6>, t<8> of the fourth and fifth symbols S3, S4 has a second logic level. The second logic gating circuit 642 may be implemented with a NOR gate.

The third logic gating circuit 643 may receive the selection signal SEL and the gating signal GT. The third logic gating circuit 643 may generate the check signal CHK based on the selection signal SEL and the gating signal GT. The third logic gating circuit 643 may generate the check signal CHK having a first logic level when both the selection signal SEL and the gating signal GT have a first logic level. The third logic gating circuit 643 may generate the check signal CHK having a second logic level when at least one of the selection signal SEL and the gating signal GT has a second logic level. The third logic gating circuit 643 may be implemented with an OR gate. The fourth logic gating circuit 644 may receive the gating signal GT, and may generate the logic bit L<0> based on the gating signal GT. The fourth logic gating circuit 644 may invert the gating signal GT to generate the logic bit L<0>. The fourth logic gating circuit 644 may generate the logic bit L<0> having a second logic level when the gating signal GT has a first logic level. The fourth logic gating circuit 644 may generate the logic bit L<0> having a first logic level when the gating signal GT has a second logic level. The fourth logic gating circuit 644 may be implemented with an odd number of inverters.

The control logic circuit 640 may further include a delay circuit 645. The delay circuit 645 may delay the selection signal SEL by a predetermined time, and provide a delayed selection signal to the third decoding circuit 630. The delay circuit 645 may delay the selection signal SEL to match the time at which the selection signal SEL is provided to the third decoding circuit 630 with the time at which the check signal CHK and the logic bit L<0> are generated. The predetermined time may correspond to a delay time from the selection signal SEL until the check signal CHK is generated and/or a delay time from the gating signal GT until the logic bit L<0> is generated. The delay circuit 645 may be implemented with an even number of inverters.

Because the first decoder 611 is configured to perform decoding operation according to the 5b3s mapping table shown in FIG. 4, and the 5b3s mapping table utilizes the 3b2s mapping table shown in FIG. 3, the first decoder 611 may be implemented by adding some logic circuits to the third and fourth decoders 621, 631. Thus, the cost of designing and manufacturing the first, third, and fourth decoders 611, 521, 531 may be reduced, and hardware cost and circuit area of the data decoding circuit 600, a receiver circuit including the data decoding circuit 600, and a semiconductor apparatus may be optimized. Furthermore, because the first to third decoding circuits 610, 620, 630 generate symbols through one decoder and one selection circuit, respectively, a delay time of a path in which the first to eleventh bits RB<0:10> are generated from the first to seventh symbols S0 to S6 can be matched, and an output skew can be reduced.

A person skilled in the art to which the present disclosure pertains will understand that the present disclosure may be carried out in other specific forms without changing its technical spirit or essential features. Therefore, it is understood that the embodiments described above are illustrative in all aspects, not limitative. The scope of the present disclosure is defined by the claims listed below rather than the detailed description, and it should be construed that the meaning and scope of the claims and all changes or modified forms derived from the equivalent concept thereof are included in the scope of the present disclosure.

What is claimed is:

1. A data encoding method, the method comprising:
  setting first to fifth bits as a first bit group, sixth to eighth bits as a second bit group, and ninth to eleventh bits as a third bit group;
  generating a check signal based on the first to fourth bits; and
  encoding the first to third bit groups based on the check signal and the fifth bit to generate first to seventh symbols,
  wherein when the check signal is at a first logic level, the first to third symbols are generated by encoding the first bit group, the fourth and fifth symbols are generated by encoding the second bit group, and the sixth and seventh symbols are generated by encoding the third bit group.

2. The method of claim 1, wherein the third to fifth bits of the first bit group, the sixth to eighth bits of the second bit group, and the ninth to eleventh bits of the third bit group are encoded based on the same mapping table.

3. The method of claim 1, wherein when the check signal is at a second logic level and the fifth bit is at the first logic level, the fourth and fifth symbols are masked, and when the check signal is at the second logic level and the fifth bit is at the second logic level, the sixth and seventh symbols are masked.

4. The method of claim 1, wherein when the check signal is at a second logic level and the fifth bit has a logic level of the first logic level or the second logic level, the third and fourth bits are encoded as the first symbol, the second bit group is encoded as the second and third symbols, the fourth and fifth symbols having a fixed value are generated, and the third bit group is encoded as the sixth and seventh symbols.

5. The method of claim 4, wherein when the check signal is at a second logic level and the fifth bit has the other logic level from the first logic level and the second logic level, the third and fourth bits are encoded as the first symbol, the second bit group is encoded as the second and third symbols, the third bit group is encoded as the fourth and fifth symbols, and the sixth and seventh symbols having a fixed value are generated.

6. A data decoding method, the method comprising:
  setting first to third symbols as a first symbol group, fourth and fifth symbols as a second symbol group, and sixth and seventh symbols as a third symbol group;
  generating a check signal based on least significant bits of the fourth to seventh symbols; and
  decoding the first to third symbol groups based on the check signal and the least significant bits of the sixth and seventh symbols to generate first to eleventh bits,
  wherein when the check signal is at a first logic level, the first symbol group is decoded as the first to fifth bits, the second symbol group is decoded as the sixth to eighth bits, and the third symbol group is decoded as the ninth to eleventh bits.

7. The method of claim 6, wherein the second and third symbols of the first symbol group, the fourth and fifth symbols of the second symbol group, and the sixth and seventh symbols of the third symbol group are decoded based on the same mapping table.

8. The method of claim 6, wherein when the check signal is at a second logic level, the first and second bits having the second logic level are generated.

9. The method of claim 6, wherein when the check signal is at a second logic level and at least one of the least significant bits of the sixth and seventh symbols is at the second logic level, the fifth bit having a logic level of one of the first logic level and the second logic level is generated, and when the check signal is at the second logic level and the least significant bits of the sixth and seventh symbols are at the first logic level, the fifth bit having a logic level of the other from the first logic level and the second logic level is generated.

10. The method of claim 6, wherein when the check signal is at a second logic level and at least one of the least significant bits of the sixth and seventh symbols is at the second logic level, the first and second bits having the second logic level are generated, the fifth bit having the first logic level is generated, the first symbol is decoded as the third and fourth bits, the first symbol group is decoded as first to fifth decoding bits, and the third to fifth decoding bits are provided as the sixth to eighth bits, and the third symbol group is decoded as the ninth to eleventh bits.

11. The method of claim 6, wherein when the check signal is at a second logic level and the least significant bits of the sixth and seventh symbols are at the first logic level, the first bit, the second bit, and the fifth bit having the second logic level are generated, the first symbol is decoded as the third and fourth bits, the first symbol group is decoded as first to fifth decoding bits, and the third to fifth decoding bits are provided as the sixth to eighth bits, and the second symbol group is decoded as the ninth to eleventh bits.

12. A data encoding circuit comprising:
  a first encoding circuit configured to encode first to fifth bits to generate first to sixth encoding bits, configured to output one of the first and second encoding bits and the third and fourth encoding bits as a first symbol based on a check signal, and configured to output the third to sixth encoding bits and seventh to tenth encoding bits as a second symbol and a third symbol based on the check signal;

a second encoding circuit configured to encode sixth to eighth bits to generate the seventh to tenth encoding bits, and configured to output one of the seventh to tenth encoding bits, eleventh to fourteenth encoding bits, and a fixed value as a fourth symbol and a fifth symbol based on the check signal and the fifth bit;

a third encoding circuit configured to encode ninth to eleventh bits to generate the eleventh to fourteenth encoding bits, and configured to output one of the eleventh to fourteenth encoding bits and the fixed value as a sixth symbol and a seventh symbol based on a selection signal;

a check logic circuit configured to generate the check signal based on the first to fourth bits; and a selection logic circuit configured to generate the selection signal based on the check signal and the fifth bit.

13. The data encoding circuit of claim 12, wherein the first encoding circuit comprises:

a first encoder configured to encode the first to fifth bits to generate the first to sixth encoding bits;

a first selection circuit configured to output the first and second encoding bits as the first symbol when the check signal is at a first logic level, and configured to output the third and fourth encoding bits as the first symbol when the check signal is at a second logic level; and a second selection circuit configured to output the third to sixth encoding bits as the second and third symbols when the check signal is at the first logic level, and configured to output the seventh to tenth encoding bits as the second and third symbols when the check signal is at the second logic level.

14. The data encoding circuit of claim 13, wherein the first encoder comprises a 5b3s encoder that encodes the first to fifth bits as the first to third symbols.

15. The data encoding circuit of claim 13, wherein the second encoding circuit comprises:

a second encoder configured to encode the sixth to eighth bits to generate the seventh to tenth encoding bits; and a third selection circuit configured to output the seventh to tenth encoding bits as the fourth and fifth symbols when the check signal is at the first logic level, configured to output the fixed value as the fourth and fifth symbols when the check signal is at the second logic level and the fifth bit is at the first logic level, and configured to output the eleventh to fourteenth encoding bits as the fourth and fifth symbols when the check signal and the fifth bit are at the second logic level.

16. The data encoding circuit of claim 15, wherein the second encoder comprises a 3b2s encoder that encodes the sixth to eighth bits as the seventh to tenth encoding bits.

17. The data encoding circuit of claim 13, wherein the third encoding circuit comprises:

a third encoder configured to encode the ninth to eleventh bits to generate the eleventh to fourteenth encoding bits; and a fourth selection circuit configured to output the eleventh to fourteenth encoding bits as the sixth and seventh symbols when the selection signal is at the first logic level, and configured to output the fixed value as the sixth and seventh symbols when the selection signal is at the second logic level.

18. The data encoding circuit of claim 17, wherein the third encoder comprises a 3b2s encoder that encodes the ninth to eleventh bits as the eleventh to fourteenth encoding bits.

19. The data encoding circuit of claim 13, wherein the check logic circuit is configured to generate the check signal having the first logic level when at least one of the first and second bits is at the first logic level or when the third and fourth bits are at the first logic level, and configured to generate the check signal having the second logic level when the first and second bits are at the second logic level and at least one of the third and fourth bits is at the second logic level.

20. The data encoding circuit of claim 13, wherein the selection logic circuit is configured to generate the selection signal having the first logic level when one of the check signal and the fifth bit is at the first logic level, and configured to generate the selection signal having the second logic level when the check signal and the fourth bit are at the second logic level.

21. A data decoding circuit comprising:

a first decoding circuit configured to decode first to third symbols to generate first to fifth decoding bits, configured to decode the first symbol to generate twelfth and thirteenth decoding bits, configured to output one of the first and second decoding bits and a fixed value as first and second bits based on a check signal, configured to output one of the third and fourth decoding bits and the twelfth and thirteenth decoding bits as third and fourth bits based on the check signal, and configured to output one of the fifth decoding bit and a logic bit as a fifth bit based on the check signal;

a second decoding circuit configured to decode fourth and fifth symbols to generate sixth to eighth decoding bits, and configured to output one of the sixth to eighth decoding bits and the third to fifth decoding bits as sixth to eighth bits based on the check signal;

a third decoding circuit configured to decode sixth and seventh symbols to generate ninth to eleventh decoding bits, and configured to output one of the ninth to eleventh decoding bits and the sixth to eighth decoding bits as ninth to eleventh bits based on a selection signal; and a control logic circuit configured to generate the check signal, the logic bit, and the selection signal based on least significant bits of the fourth to seventh symbols.

22. The data decoding circuit of claim 21, wherein the first decoding circuit comprises:

a first decoder configured to decode the first to third symbols to generate the first to fifth decoding bits;

a second decoder configured to decode the first symbol to generate the twelfth and thirteenth decoding bits;

a first selection circuit configured to output the first and second decoding bits as the first and second bits when the check signal is at a first logic level, and configured to output the fixed value as the first and second bits when the check signal is at a second logic level;

a second selection circuit configured to output the third and fourth decoding bits as the third and fourth bits when the check signal is at the first logic level, and configured to output the twelfth and thirteenth decoding bits as the third and fourth bits when the check signal is at the second logic level; and a third selection circuit configured to output the fifth decoding bit as the fifth bit when the check signal is at the first logic level, and configured to output the logic bit as the fifth bit when the check signal is at the second logic level.

23. The data decoding circuit of claim 22, wherein the first decoder comprises a 3s5b decoder that decodes the first to third symbols as the first to fifth decoding bits.

24. The data decoding circuit of claim 22, wherein the second decoder comprises a 1s2b decoder that decodes the first symbol as the twelfth and thirteenth decoding bits.

25. The data decoding circuit of claim 21, wherein the second decoding circuit comprises:

a third decoder configured to decode the fourth and fifth symbols to generate the sixth to eighth decoding bits; and a fourth selection circuit configured to output the sixth to eighth decoding bits as the sixth to eighth bits when the check signal is at a first logic level, and configured to output the third to fifth decoding bits as the sixth to eighth bits when the check signal is at a second logic level.

26. The data decoding circuit of claim 25, wherein the third decoder comprises a 2s3b decoder that decodes fourth and fifth symbols as the sixth and eighth decoding bits.

27. The data decoding circuit of claim 21, wherein the third decoding circuit comprises:

a fourth decoder configured to decode the sixth and seventh symbols to generate the ninth to eleventh decoding bits; and a fifth selection circuit configured to output the ninth to eleventh decoding bits as the ninth to eleventh bits when the check signal is at a first logic level, and configured to output the sixth to eighth decoding bits as the ninth to eleventh bits when the check signal is at a second logic level.

28. The data decoding circuit of claim 27, wherein the fourth decoder comprises a 2s3b decoder that decodes the sixth and seventh symbols as the ninth and eleventh decoding bits.

29. The data decoding circuit of claim 21, wherein the control logic circuit comprises:

a first logic gating circuit configured to generate the selection signal based on the least significant bits of the sixth and seventh symbols;

a second logic gating circuit configured to generate a gating signal based on the least significant bits of the fourth and fifth symbols;

a third logic gating circuit configured to generate the check signal based on the selection signal and the gating signal; and a fourth logic gating circuit configured to generate the logic bit by inverting the gating signal.

30. The data decoding circuit of claim 29, wherein the first logic gating circuit is configured to generate the selection signal having a second logic level when the least significant bits of the sixth and seventh symbols are at a first logic level, and configured to generate the selection signal having the first logic level when at least one of the least significant bits of the sixth and seventh symbols is at the second logic level.

31. The data decoding circuit of claim 29, wherein the second logic gating circuit is configured to generate the gating signal having a second logic level when the least significant bits of the fourth and fifth symbols are at a first logic level, and configured to generate the gating signal having the first logic level when at least one of the least significant bits of the fourth and fifth symbols is at the second logic level.

32. The data decoding circuit of claim 29, wherein the third logic gating circuit is configured to generate the check signal having a first logic level when the selection signal and the gating signal are at the first logic level, and configured to generate the check signal having a second logic level when at least one of the selection signal and the gating signal is at the second logic level.

33. The data decoding circuit of claim 29, wherein the control logic circuit further comprises a delay circuit configured to delay the selection signal by a time corresponding to a time from when the gating signal is generated to when the check signal is generated.

* * * * *